(12) United States Patent
Hong et al.

(10) Patent No.: US 11,533,745 B2
(45) Date of Patent: Dec. 20, 2022

(54) OPERATION METHOD OF UE ASSOCIATED WITH SCI IN WIRELESS COMMUNICATION SYSTEM

(71) Applicant: LG Electronics Inc., Seoul (KR)

(72) Inventors: Uihyun Hong, Seoul (KR); Seungmin Lee, Seoul (KR); Daesung Hwang, Seoul (KR); Hanbyul Seo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 17/737,484

(22) Filed: May 5, 2022

(65) Prior Publication Data

US 2022/0264619 A1    Aug. 18, 2022

Related U.S. Application Data

(63) Continuation of application No. PCT/KR2020/015375, filed on Nov. 5, 2020.

(60) Provisional application No. 62/931,091, filed on Nov. 5, 2019.

(30) Foreign Application Priority Data

Jan. 21, 2020 (KR) .......... 10-2020-0008143
Feb. 13, 2020 (KR) .......... 10-2020-0017983

(51) Int. Cl.
*H04W 72/12* (2009.01)
*H04L 1/00* (2006.01)
*H04W 92/18* (2009.01)

(52) U.S. Cl.
CPC ....... *H04W 72/1278* (2013.01); *H04L 1/0061* (2013.01); *H04W 92/18* (2013.01)

(58) Field of Classification Search
CPC ............... H04L 1/0061; H04L 1/0063; H04W 72/1278; H04W 92/18
See application file for complete search history.

(56) References Cited

U.S. PATENT DOCUMENTS

| | | | |
|---|---|---|---|
| 2021/0068101 A1* | 3/2021 | Chen | H04L 1/0061 |
| 2021/0105119 A1* | 4/2021 | Sarkis | H04W 72/1278 |
| 2022/0052822 A1* | 2/2022 | Lin | H04W 72/0406 |
| 2022/0225316 A1* | 7/2022 | Su | H04L 1/0061 |

FOREIGN PATENT DOCUMENTS

WO    WO2019195505    10/2019

OTHER PUBLICATIONS

Ericsson, "PHY layer structure for NR sidelink," R1-1910532, Presented at 3GPP TSG-RAN WG1 Meeting #98bis, Chongqing, China, Oct. 14-20, 2019, 19 pages.

(Continued)

*Primary Examiner* — Thomas R Cairns
(74) *Attorney, Agent, or Firm* — Fish & Richardson P.C.

(57) ABSTRACT

One embodiment is an operation method of a user equipment (UE) in a wireless communication system, the method comprising the steps of: transmitting a 1st stage sidelink control information (SCI) on a PSCCH; and transmitting a 2nd stage SCI on a PSSCH, wherein a first scrambling sequence associated with the 1st stage SCI is generated on the basis of a fixed value, and a second scrambling sequence associated with the 2nd stage SCI is generated on the basis of a cyclic redundancy check (CRC)—related value.

11 Claims, 19 Drawing Sheets

(56) References Cited

OTHER PUBLICATIONS

International Search Report and Written Opinion in International Appln. No. PCT/KR2020/015375, dated Feb. 24, 2021, 10 pages (With English Translation).
LG Electronics, "Discussion on physical layer structure for NR sidelink," R1-1911346, Presented at 3GPP TSG RAN WG1 #98bis, Chongqing, China, Oct. 14-20, 2019, 41 pages.
Samsung, "On physical layer structures for Nr V2X," R1-1910469, Presented at 3GPP TSG RAN WG1 #98bis Meeting, Chongqing, China, Oct. 14-20, 2019, 13 pages.
Vivo, "Physical layer structure for NR sidelink," R1-1911418, Presented at 3GPP TSG RAN WG1 #98bis Meeting, Chongqing, China, Oct. 14-20, 2019, 22 pages.

* cited by examiner

SL symbol index 0 1 2 3 4 5 6 7 8 9 10 11 12 13

SL symbol index 0 1 2 3 4 5 6 7 8 9 10 11 12 13

SL symbol index 0 1 2 3 4 5 6 7 8 9 10 11 12 13

- AGC duration
- Tx/Rx switching
- PSSCH DMRS
- PSCCH
- PTRS

OPERATION METHOD OF UE ASSOCIATED WITH SCI IN WIRELESS COMMUNICATION SYSTEM

CROSS-REFERENCE TO RELATED APPLICATIONS

This application is a continuation of International Application No. PCT/KR2020/015375, filed on Nov. 5, 2020, which claims the benefit of Korean Application No. 10-2020-0017983, filed on Feb. 13, 2020, Korean Application No. 10-2020-0008143, filed on Jan. 21, 2020, and U.S. Provisional Application No. 62/931,091, filed on Nov. 5, 2019. The disclosures of the prior applications are hereby incorporated by reference herein in their entirety.

TECHNICAL FIELD

The following description relates to a wireless communication system, and more particularly to an operation method and apparatus of a sidelink control information (SCI) scrambling sequence related user equipment (UE).

BACKGROUND

Wireless communication systems are being widely deployed to provide various types of communication services such as voice and data. In general, a wireless communication system is a multiple access system capable of supporting communication with multiple users by sharing available system resources (bandwidth, transmission power, etc.). Examples of the multiple access system include a code division multiple access (CDMA) system, a frequency division multiple access (FDMA) system, a time division multiple access (TDMA) system, an orthogonal frequency division multiple access (OFDMA) system, and a single carrier frequency division multiple access (SC-FDMA) system, and a multi carrier frequency division multiple access (MC-FDMA) system.

A wireless communication system uses various radio access technologies (RATs) such as long term evolution (LTE), LTE-advanced (LTE-A), and wireless fidelity (WiFi). 5th generation (5G) is such a wireless communication system. Three key requirement areas of 5G include (1) enhanced mobile broadband (eMBB), (2) massive machine type communication (mMTC), and (3) ultra-reliable and low latency communications (URLLC). Some use cases may require multiple dimensions for optimization, while others may focus only on one key performance indicator (KPI). 5G supports such diverse use cases in a flexible and reliable way.

eMBB goes far beyond basic mobile Internet access and covers rich interactive work, media and entertainment applications in the cloud or augmented reality (AR). Data is one of the key drivers for 5G and in the 5G era, we may for the first time see no dedicated voice service. In 5G, voice is expected to be handled as an application program, simply using data connectivity provided by a communication system. The main drivers for an increased traffic volume are the increase in the size of content and the number of applications requiring high data rates. Streaming services (audio and video), interactive video, and mobile Internet connectivity will continue to be used more broadly as more devices connect to the Internet. Many of these applications require always-on connectivity to push real time information and notifications to users. Cloud storage and applications are rapidly increasing for mobile communication platforms. This is applicable for both work and entertainment. Cloud storage is one particular use case driving the growth of uplink data rates. 5G will also be used for remote work in the cloud which, when done with tactile interfaces, requires much lower end-to-end latencies in order to maintain a good user experience. Entertainment, for example, cloud gaming and video streaming, is another key driver for the increasing need for mobile broadband capacity. Entertainment will be very essential on smart phones and tablets everywhere, including high mobility environments such as trains, cars and airplanes. Another use case is augmented reality (AR) for entertainment and information search, which requires very low latencies and significant instant data volumes.

One of the most expected 5G use cases is the functionality of actively connecting embedded sensors in every field, that is, mMTC. It is expected that there will be 20.4 billion potential Internet of things (IoT) devices by 2020. In industrial IoT, 5G is one of areas that play key roles in enabling smart city, asset tracking, smart utility, agriculture, and security infrastructure.

URLLC includes services which will transform industries with ultra-reliable/available, low latency links such as remote control of critical infrastructure and self-driving vehicles. The level of reliability and latency are vital to smart-grid control, industrial automation, robotics, drone control and coordination, and so on.

Now, multiple use cases will be described in detail.

5G may complement fiber-to-the home (FTTH) and cable-based broadband (or data-over-cable service interface specifications (DOCSIS)) as a means of providing streams at data rates of hundreds of megabits per second to giga bits per second. Such a high speed is required for TV broadcasts at or above a resolution of 4K (6K, 8K, and higher) as well as virtual reality (VR) and AR. VR and AR applications mostly include immersive sport games. A special network configuration may be required for a specific application program. For VR games, for example, game companies may have to integrate a core server with an edge network server of a network operator in order to minimize latency.

The automotive sector is expected to be a very important new driver for 5G, with many use cases for mobile communications for vehicles. For example, entertainment for passengers requires simultaneous high capacity and high mobility mobile broadband, because future users will expect to continue their good quality connection independent of their location and speed. Other use cases for the automotive sector are AR dashboards. These display overlay information on top of what a driver is seeing through the front window, identifying objects in the dark and telling the driver about the distances and movements of the objects. In the future, wireless modules will enable communication between vehicles themselves, information exchange between vehicles and supporting infrastructure and between vehicles and other connected devices (e.g., those carried by pedestrians). Safety systems may guide drivers on alternative courses of action to allow them to drive more safely and lower the risks of accidents. The next stage will be remote-controlled or self-driving vehicles. These require very reliable, very fast communication between different self-driving vehicles and between vehicles and infrastructure. In the future, self-driving vehicles will execute all driving activities, while drivers are focusing on traffic abnormality elusive to the vehicles themselves. The technical requirements for self-driving vehicles call for ultra-low latencies and ultra-high reliability, increasing traffic safety to levels humans cannot achieve.

Smart cities and smart homes, often referred to as smart society, will be embedded with dense wireless sensor networks. Distributed networks of intelligent sensors will identify conditions for cost- and energy-efficient maintenance of the city or home. A similar setup can be done for each home, where temperature sensors, window and heating controllers, burglar alarms, and home appliances are all connected wirelessly. Many of these sensors are typically characterized by low data rate, low power, and low cost, but for example, real time high definition (HD) video may be required in some types of devices for surveillance.

The consumption and distribution of energy, including heat or gas, is becoming highly decentralized, creating the need for automated control of a very distributed sensor network. A smart grid interconnects such sensors, using digital information and communications technology to gather and act on information. This information may include information about the behaviors of suppliers and consumers, allowing the smart grid to improve the efficiency, reliability, economics and sustainability of the production and distribution of fuels such as electricity in an automated fashion. A smart grid may be seen as another sensor network with low delays.

The health sector has many applications that may benefit from mobile communications. Communications systems enable telemedicine, which provides clinical health care at a distance. It helps eliminate distance barriers and may improve access to medical services that would often not be consistently available in distant rural communities. It is also used to save lives in critical care and emergency situations. Wireless sensor networks based on mobile communication may provide remote monitoring and sensors for parameters such as heart rate and blood pressure.

Wireless and mobile communications are becoming increasingly important for industrial applications. Wires are expensive to install and maintain, and the possibility of replacing cables with reconfigurable wireless links is a tempting opportunity for many industries. However, achieving this requires that the wireless connection works with a similar delay, reliability and capacity as cables and that its management is simplified. Low delays and very low error probabilities are new requirements that need to be addressed with 5G Finally, logistics and freight tracking are important use cases for mobile communications that enable the tracking of inventory and packages wherever they are by using location-based information systems. The logistics and freight tracking use cases typically require lower data rates but need wide coverage and reliable location information.

A wireless communication system is a multiple access system that supports communication of multiple users by sharing available system resources (a bandwidth, transmission power, etc.). Examples of multiple access systems include a CDMA system, an FDMA system, a TDMA system, an OFDMA system, an SC-FDMA system, and an MC-FDMA system.

Sidelink (SL) refers to a communication scheme in which a direct link is established between user equipments (UEs) and the UEs directly exchange voice or data without intervention of a base station (BS). SL is considered as a solution of relieving the BS of the constraint of rapidly growing data traffic.

Vehicle-to-everything (V2X) is a communication technology in which a vehicle exchanges information with another vehicle, a pedestrian, and infrastructure by wired/wireless communication. V2X may be categorized into four types: vehicle-to-vehicle (V2V), vehicle-to-infrastructure (V2I), vehicle-to-network (V2N), and vehicle-to-pedestrian (V2P). V2X communication may be provided via a PC5 interface and/or a Uu interface.

As more and more communication devices demand larger communication capacities, there is a need for enhanced mobile broadband communication relative to existing RATs. Accordingly, a communication system is under discussion, for which services or UEs sensitive to reliability and latency are considered. The next-generation RAT in which eMBB, MTC, and URLLC are considered is referred to as new RAT or NR. In NR, V2X communication may also be supported.

FIG. 1 is a diagram illustrating V2X communication based on pre-NR RAT and V2X communication based on NR in comparison.

For V2X communication, a technique of providing safety service based on V2X messages such as basic safety message (BSM), cooperative awareness message (CAM), and decentralized environmental notification message (DENM) was mainly discussed in the pre-NR RAT. The V2X message may include location information, dynamic information, and attribute information. For example, a UE may transmit a CAM of a periodic message type and/or a DENM of an event-triggered type to another UE.

For example, the CAM may include basic vehicle information including dynamic state information such as a direction and a speed, vehicle static data such as dimensions, an external lighting state, path details, and so on. For example, the UE may broadcast the CAM which may have a latency less than 100 ms. For example, when an unexpected incident occurs, such as breakage or an accident of a vehicle, the UE may generate the DENM and transmit the DENM to another UE. For example, all vehicles within the transmission range of the UE may receive the CAM and/or the DENM. In this case, the DENM may have priority over the CAM.

In relation to V2X communication, various V2X scenarios are presented in NR. For example, the V2X scenarios include vehicle platooning, advanced driving, extended sensors, and remote driving.

For example, vehicles may be dynamically grouped and travel together based on vehicle platooning. For example, to perform platoon operations based on vehicle platooning, the vehicles of the group may receive periodic data from a leading vehicle. For example, the vehicles of the group may widen or narrow their gaps based on the periodic data.

For example, a vehicle may be semi-automated or full-automated based on advanced driving. For example, each vehicle may adjust a trajectory or maneuvering based on data obtained from a nearby vehicle and/or a nearby logical entity. For example, each vehicle may also share a dividing intention with nearby vehicles.

Based on extended sensors, for example, raw or processed data obtained through local sensor or live video data may be exchanged between vehicles, logical entities, terminals of pedestrians and/or V2X application servers. Accordingly, a vehicle may perceive an advanced environment relative to an environment perceivable by its sensor.

Based on remote driving, for example, a remote driver or a V2X application may operate or control a remote vehicle on behalf of a person incapable of driving or in a dangerous environment. For example, when a path may be predicted as in public transportation, cloud computing-based driving may be used in operating or controlling the remote vehicle. For example, access to a cloud-based back-end service platform may also be used for remote driving.

A scheme of specifying service requirements for various V2X scenarios including vehicle platooning, advanced driving, extended sensors, and remote driving is under discussion in NR-based V2X communication.

SUMMARY

An objective of embodiment(s) is to provide scrambling sequence generation of $1^{st}$ sidelink control information (SCI) and $2^{nd}$ SCI.

According to an embodiment, an operation method of a user equipment (UE) in a wireless communication system may include transmitting a $1^{st}$ stage sidelink control information (SCI) on a PSCCH, and transmitting a $2^{nd}$ stage SCI on a PSSCH, wherein a first scrambling sequence related to the $1^{st}$ stage SCI is generated based on a fixed value, and a second scrambling sequence related to the $2^{nd}$ stage SCI is generated based on a cyclic redundancy check (CRC) related value.

According to an embodiment, a user equipment (UE) in a wireless communication system includes at least one processor, and at least one computer memory operatively connected to the at least one processor and configured to store instructions that when executed causes the at least one processor to perform operations, the operations including transmitting a $1^{st}$ stage sidelink control information (SCI) on a PSCCH, and transmitting a $2^{nd}$ stage SCI on a PSSCH, wherein a first scrambling sequence related to the $1^{st}$ stage SCI is generated based on a fixed value, and a second scrambling sequence related to the $2^{nd}$ stage SCI is generated based on a cyclic redundancy check (CRC) related value.

An embodiment provides a processor for performing operations for a user equipment (UE) in a wireless communication system, the operations including transmitting a $1^{st}$ stage sidelink control information (SCI) on a PSCCH, and transmitting a $2^{nd}$ stage SCI on a PSSCH, wherein a first scrambling sequence related to the $1^{st}$ stage SCI is generated based on a fixed value, and a second scrambling sequence related to the $2^{nd}$ stage SCI is generated based on a cyclic redundancy check (CRC) related value.

An embodiment provides a computer readable storage medium storing at least one computer program that includes instructions that, when executed by at least one processor, causes the at least one processor to perform operations for a user equipment, the operations including transmitting a $1^{st}$ stage sidelink control information (SCI) on a PSCCH, and transmitting a $2^{nd}$ stage SCI on a PSSCH, wherein a first scrambling sequence related to the $1^{st}$ stage SCI is generated based on a fixed value, and a second scrambling sequence related to the $2^{nd}$ stage SCI is generated based on a cyclic redundancy check (CRC) related value.

The CRC related value may be derived from CRC on a PSCCH.

The fixed value may be related to initialization of the first scrambling sequence.

CRC on the PSCCH may be related to initialization of the second scrambling sequence.

The UE may communicate with at least one of another UE, a UE related to autonomous driving vehicle, a base station (BS), or a network.

According to an embodiment, an initial value of a scrambling sequence may be determined in consideration of the characteristics/target of user equipments (UEs) that receive different types of sidelink control information (SCI). Randomization of $2^{nd}$ SCI may be effectively performed by determining an initial value of a scrambling sequence in consideration of the characteristics/target of user equipments (UEs) that receive different types of SCI.

BRIEF DESCRIPTION OF THE DRAWINGS

The accompanying drawings are provided to provide an understanding of the present disclosure, and are intended to illustrate various embodiments of the present disclosure and, together with the description of the specification, explain the principles of the present disclosure.

FIGS. 11A to 12C are diagrams for explaining embodiment(s).

DETAILED DESCRIPTION

In various embodiments of the present disclosure, "/" and "," should be interpreted as "and/or". For example, "A/B" may mean "A and/or B". Further, "A, B" may mean "A and/or B". Further, "A/B/C" may mean "at least one of A, B and/or C". Further, "A, B, C" may mean "at least one of A, B and/or C".

In various embodiments of the present disclosure, "or" should be interpreted as "and/or". For example, "A or B" may include "only A", "only B", and/or "both A and B". In other words, "or" should be interpreted as "additionally or alternatively".

Techniques described herein may be used in various wireless access systems such as code division multiple access (CDMA), frequency division multiple access (FDMA), time division multiple access (TDMA), orthogonal frequency division multiple access (OFDMA), single carrier-frequency division multiple access (SC-FDMA), and so on. CDMA may be implemented as a radio technology such as universal terrestrial radio access (UTRA) or CDMA2000. TDMA may be implemented as a radio technology such as global system for mobile communications (GSM)/general packet radio service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, evolved-UTRA (E-UTRA), or the like. IEEE 802.16m is an evolution of IEEE 802.16e, offering backward compatibility with an IRRR 802.16e-based system. UTRA is a part of universal mobile telecommunications system (UMTS). 3rd generation partnership project (3GPP) long term evolution (LTE) is a part of evolved UMTS (E-UMTS) using evolved UTRA (E-UTRA). 3GPP LTE employs OFDMA for downlink (DL) and SC-FDMA for uplink (UL). LTE-advanced (LTE-A) is an evolution of 3GPP LTE.

A successor to LTE-A, $5^{th}$ generation (5G) new radio access technology (NR) is a new clean-state mobile communication system characterized by high performance, low latency, and high availability. 5G NR may use all available spectral resources including a low frequency band below 1 GHz, an intermediate frequency band between 1 GHz and 10 GHz, and a high frequency (millimeter) band of 24 GHz or above.

While the following description is given mainly in the context of LTE-A or 5G NR for the clarity of description, the technical idea of an embodiment of the present disclosure is not limited thereto.

Figure 1:
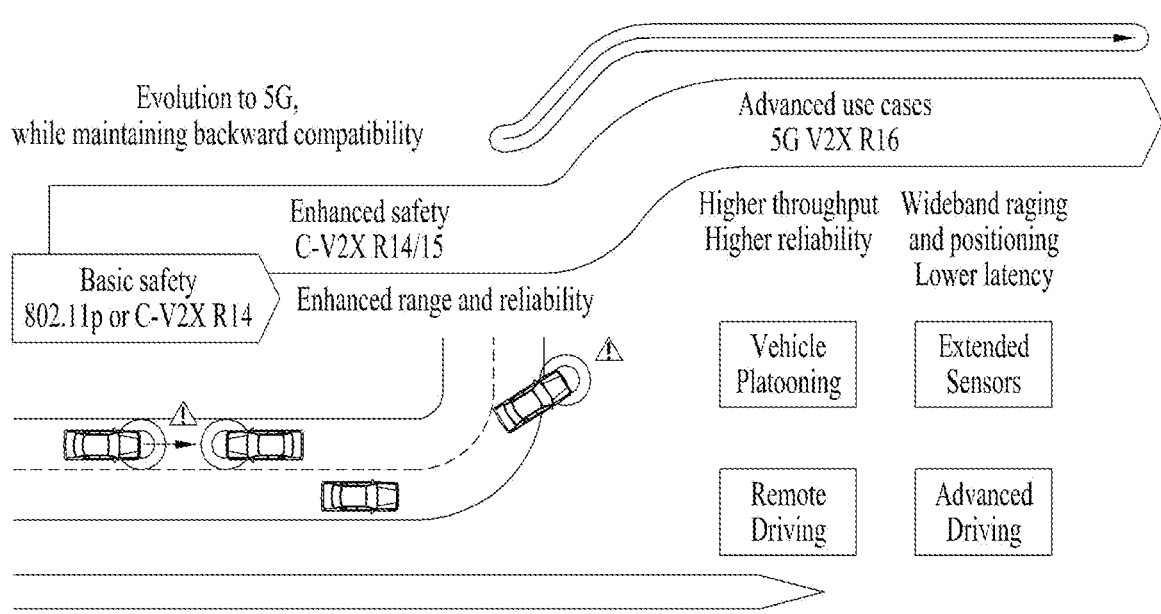
FIG. 1 is a diagram illustrating V2X communication based on pre-NR RAT and V2X communication based on NR in comparison.
Figure 2:
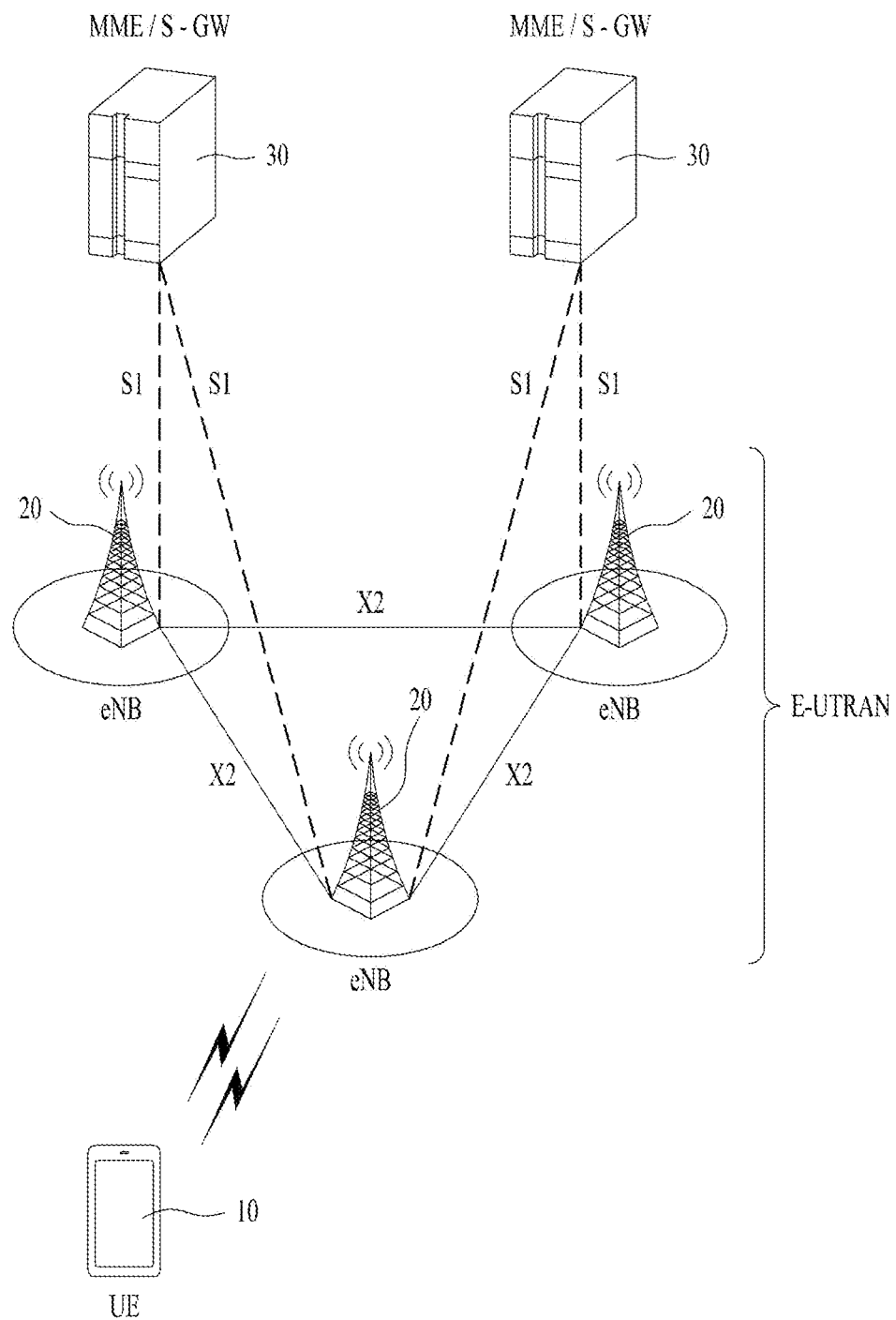
FIG. 2 illustrates the structure of an LTE system according to an embodiment of the present disclosure.

FIG. 2 illustrates the structure of an LTE system according to an embodiment of the present disclosure. This may also be called an evolved UMTS terrestrial radio access network (E-UTRAN) or LTE/LTE-A system.

Referring to FIG. 2, the E-UTRAN includes evolved Node Bs (eNBs) 20 which provide a control plane and a user plane to UEs 10. A UE 10 may be fixed or mobile, and may also be referred to as a mobile station (MS), user terminal (UT), subscriber station (SS), mobile terminal (MT), or wireless device. An eNB 20 is a fixed station communication with the UE 10 and may also be referred to as a base station (BS), a base transceiver system (BTS), or an access point.

eNBs 20 may be connected to each other via an X2 interface. An eNB 20 is connected to an evolved packet core (EPC) 39 via an S1 interface. More specifically, the eNB 20 is connected to a mobility management entity (MME) via an S1-MME interface and to a serving gateway (S-GW) via an S1-U interface.

The EPC 30 includes an MME, an S-GW, and a packet data network-gateway (P-GW). The MME has access information or capability information about UEs, which are mainly used for mobility management of the UEs. The S-GW is a gateway having the E-UTRAN as an end point, and the P-GW is a gateway having a packet data network (PDN) as an end point.

Based on the lowest three layers of the open system interconnection (OSI) reference model known in communication systems, the radio protocol stack between a UE and a network may be divided into Layer 1 (L1), Layer 2 (L2) and Layer 3 (L3). These layers are defined in pairs between a UE and an Evolved UTRAN (E-UTRAN), for data transmission via the Uu interface. The physical (PHY) layer at L1 provides an information transfer service on physical channels. The radio resource control (RRC) layer at L3 functions to control radio resources between the UE and the network. For this purpose, the RRC layer exchanges RRC messages between the UE and an eNB.

Figures 3A, 3B:
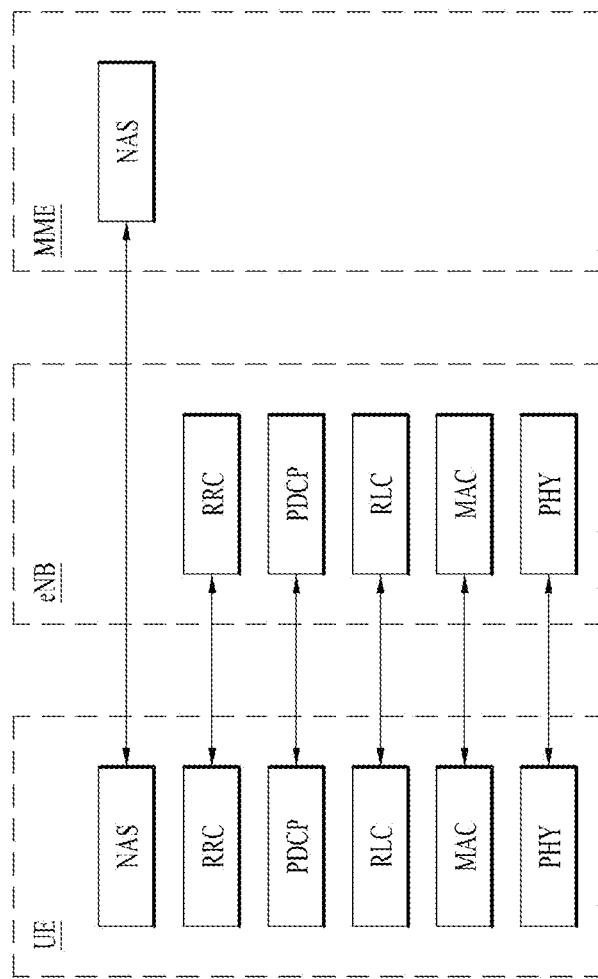
FIGS. 3A and 3B illustrate radio protocol architectures for a user plane and a control plane according to an embodiment of the disclosure.

FIG. 3A illustrates a user-plane radio protocol architecture according to an embodiment of the disclosure.

FIG. 3B illustrates a control-plane radio protocol architecture according to an embodiment of the disclosure. A user plane is a protocol stack for user data transmission, and a control plane is a protocol stack for control signal transmission.

Referring to FIGS. 3A and 3B, the PHY layer provides an information transfer service to its higher layer on physical channels. The PHY layer is connected to the medium access control (MAC) layer through transport channels and data is transferred between the MAC layer and the PHY layer on the transport channels. The transport channels are divided according to features with which data is transmitted via a radio interface.

Data is transmitted on physical channels between different PHY layers, that is, the PHY layers of a transmitter and a receiver. The physical channels may be modulated in orthogonal frequency division multiplexing (OFDM) and use time and frequencies as radio resources.

The MAC layer provides services to a higher layer, radio link control (RLC) on logical channels. The MAC layer provides a function of mapping from a plurality of logical channels to a plurality of transport channels. Further, the MAC layer provides a logical channel multiplexing function by mapping a plurality of logical channels to a single transport channel. A MAC sublayer provides a data transmission service on the logical channels.

The RLC layer performs concatenation, segmentation, and reassembly for RLC serving data units (SDUs). In order to guarantee various quality of service (QoS) requirements of each radio bearer (RB), the RLC layer provides three operation modes, transparent mode (TM), unacknowledged mode (UM), and acknowledged Mode (AM). An AM RLC provides error correction through automatic repeat request (ARQ).

The RRC layer is defined only in the control plane and controls logical channels, transport channels, and physical channels in relation to configuration, reconfiguration, and release of RBs. An RB refers to a logical path provided by L1 (the PHY layer) and L2 (the MAC layer, the RLC layer, and the packet data convergence protocol (PDCP) layer), for data transmission between the UE and the network.

The user-plane functions of the PDCP layer include user data transmission, header compression, and ciphering. The control-plane functions of the PDCP layer include control-plane data transmission and ciphering/integrity protection.

RB establishment amounts to a process of defining radio protocol layers and channel features and configuring specific parameters and operation methods in order to provide a specific service. RBs may be classified into two types, signaling radio bearer (SRB) and data radio bearer (DRB). The SRB is used as a path in which an RRC message is transmitted on the control plane, whereas the DRB is used as a path in which user data is transmitted on the user plane.

Once an RRC connection is established between the RRC layer of the UE and the RRC layer of the E-UTRAN, the UE is placed in RRC_CONNECTED state, and otherwise, the UE is placed in RRC_IDLE state. In NR, RRC_INACTIVE state is additionally defined. A UE in the RRC_INACTIVE state may maintain a connection to a core network, while releasing a connection from an eNB.

DL transport channels carrying data from the network to the UE include a broadcast channel (BCH) on which system information is transmitted and a DL shared channel (DL SCH) on which user traffic or a control message is transmitted. Traffic or a control message of a DL multicast or broadcast service may be transmitted on the DL-SCH or a DL multicast channel (DL MCH). UL transport channels carrying data from the UE to the network include a random access channel (RACH) on which an initial control message is transmitted and an UL shared channel (UL SCH) on which user traffic or a control message is transmitted.

The logical channels which are above and mapped to the transport channels include a broadcast control channel (BCCH), a paging control channel (PCCH), a common control channel (CCCH), a multicast control channel (MCCH), and a multicast traffic channel (MTCH).

A physical channel includes a plurality of OFDM symbol in the time domain by a plurality of subcarriers in the frequency domain. One subframe includes a plurality of OFDM symbols in the time domain. An RB is a resource allocation unit defined by a plurality of OFDM symbols by a plurality of subcarriers. Further, each subframe may use specific subcarriers of specific OFDM symbols (e.g., the first OFDM symbol) in a corresponding subframe for a physical DL control channel (PDCCH), that is, an L1/L2 control channel. A transmission time interval (TTI) is a unit time for subframe transmission.

Figure 4:
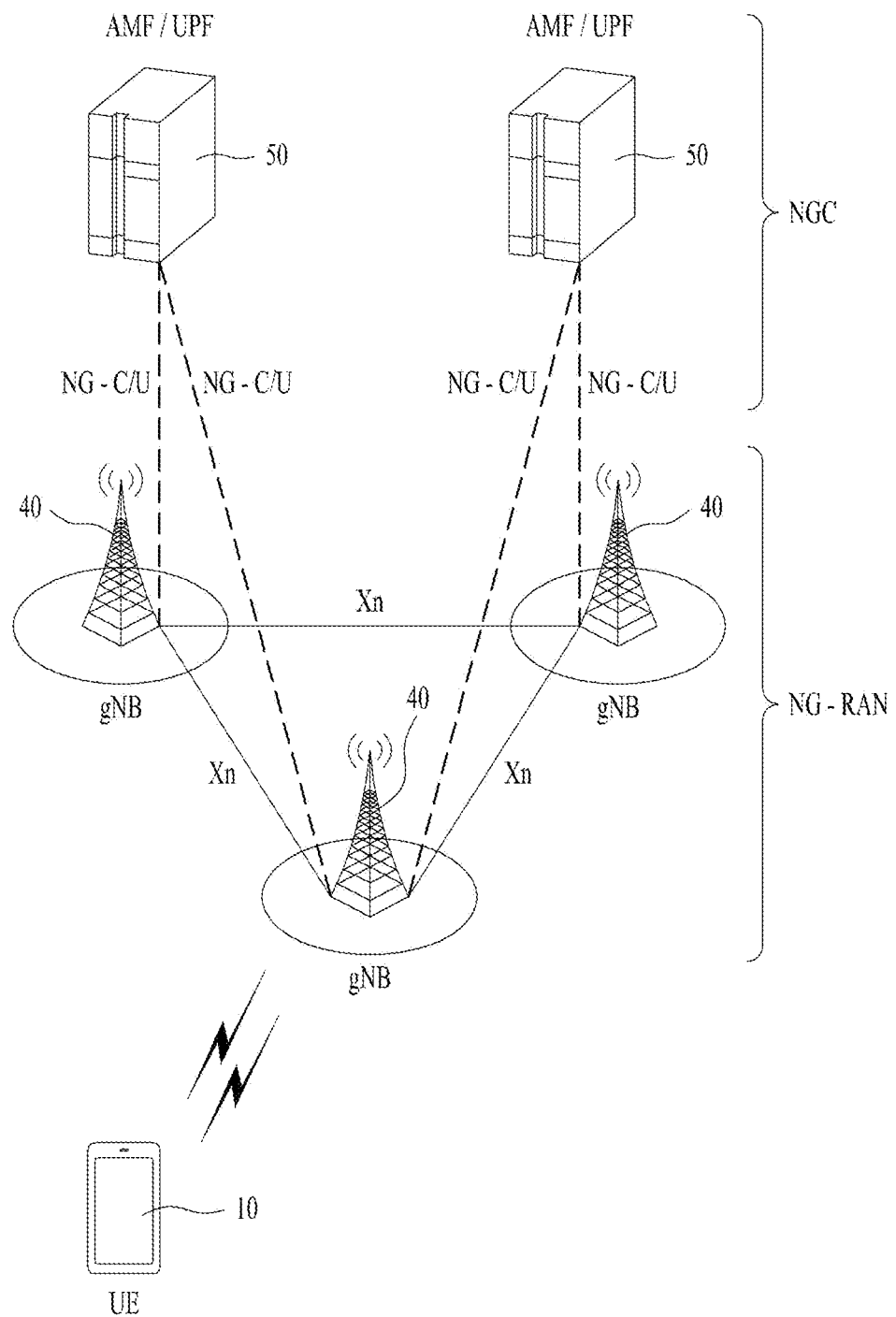
FIG. 4 illustrates the structure of an NR system according to an embodiment of the present disclosure.

FIG. 4 illustrates the structure of an NR system according to an embodiment of the present disclosure.

Referring to FIG. 4, a next generation radio access network (NG-RAN) may include a next generation Node B (gNB) and/or an eNB, which provides user-plane and control-plane protocol termination to a UE. In FIG. 4, the NG-RAN is shown as including only gNBs, by way of example. A gNB and an eNB are connected to each other via an Xn interface. The gNB and the eNB are connected to a 5G core network (5GC) via an NG interface. More specifically, the gNB and the eNB are connected to an access and mobility management function (AMF) via an NG-C interface and to a user plane function (UPF) via an NG-U interface.

Figure 5:
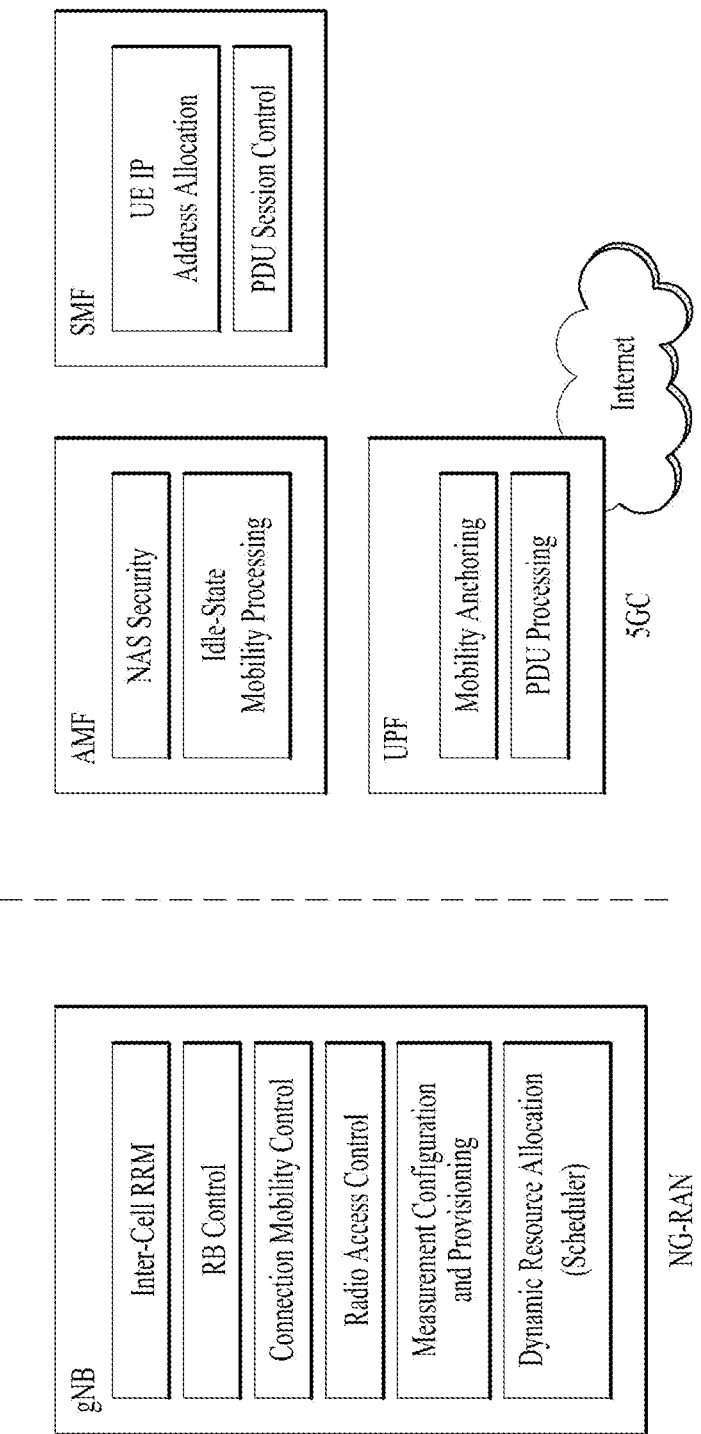
FIG. 5 illustrates functional split between the NG-RAN and the 5GC according to an embodiment of the present disclosure.

FIG. 5 illustrates functional split between the NG-RAN and the 5GC according to an embodiment of the present disclosure.

Referring to FIG. 5, a gNB may provide functions including inter-cell radio resource management (RRM), radio admission control, measurement configuration and provision, and dynamic resource allocation. The AMF may provide functions such as non-access stratum (NAS) security and idle-state mobility processing. The UPF may provide functions including mobility anchoring and protocol data unit (PDU) processing. A session management function (SMF) may provide functions including UE Internet protocol (IP) address allocation and PDU session control.

Figure 6:
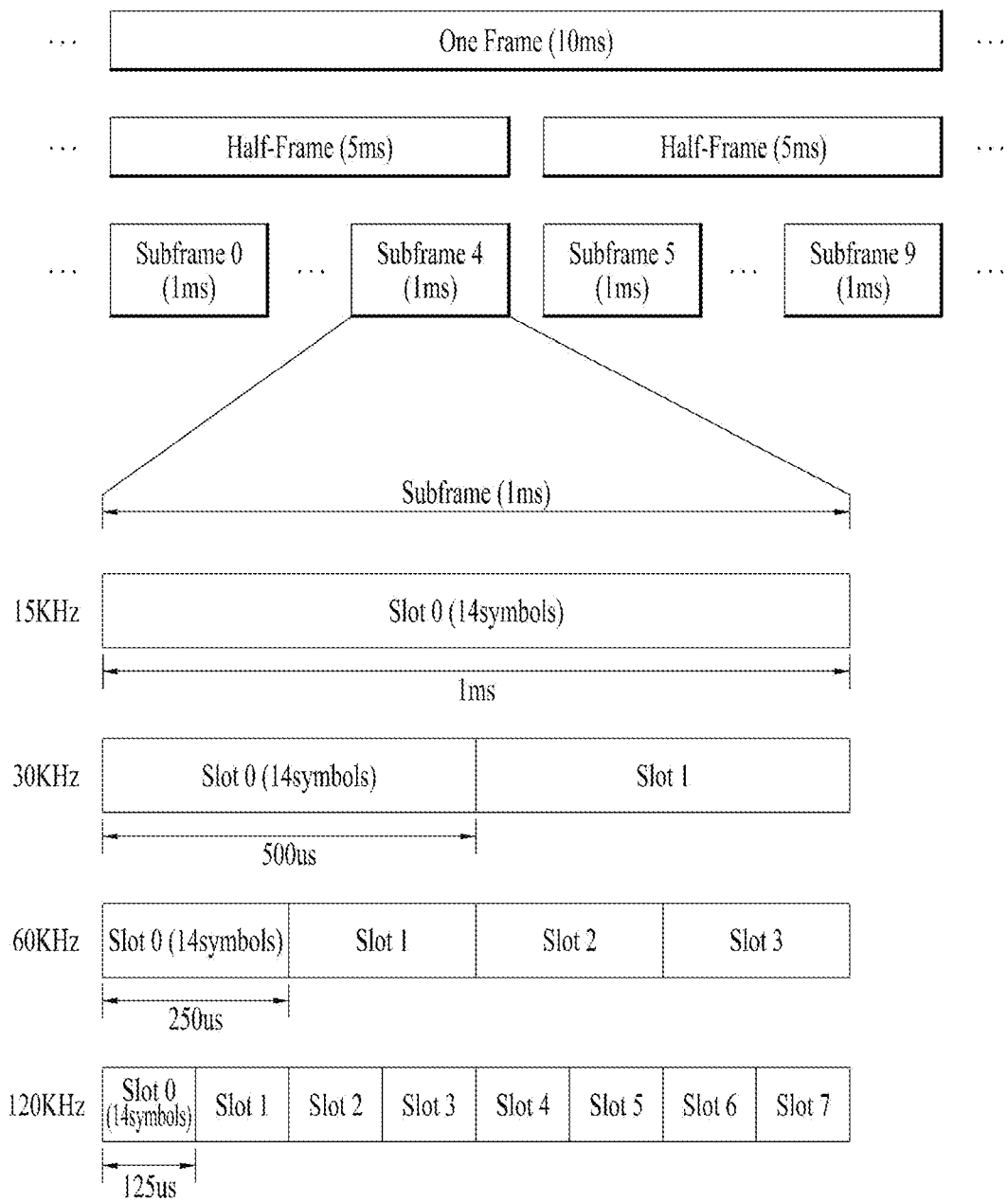
FIG. 6 illustrates a radio frame structure in NR, to which embodiment(s) of the present disclosure is applicable.

FIG. 6 illustrates a radio frame structure in NR, to which embodiment(s) of the present disclosure is applicable.

Referring to FIG. 6, a radio frame may be used for UL transmission and DL transmission in NR. A radio frame is 10 ms in length, and may be defined by two 5-ms half-frames. An HF may include five 1-ms subframes. A subframe may be divided into one or more slots, and the number of slots in an SF may be determined according to a subcarrier spacing (SCS). Each slot may include 12 or 14 OFDM(A) symbols according to a cyclic prefix (CP).

In a normal CP (NCP) case, each slot may include 14 symbols, whereas in an extended CP (ECP) case, each slot may include 12 symbols. Herein, a symbol may be an OFDM symbol (or CP-OFDM symbol) or an SC-FDMA symbol (or DFT-s-OFDM symbol).

Table 1 below lists the number of symbols per slot $N^{slot}_{symb}$, the number of slots per frame $N^{frame,u}_{slot}$, and the number of slots per subframe $N^{subframe,u}_{slot}$ according to an SCS configuration μ in the NCP case.

TABLE 1

| SCS (15*2u) | $N^{slot}_{symb}$ | $N^{frame,u}_{slot}$ | $N^{subframe,u}_{slot}$ |
|---|---|---|---|
| 15 KHz (u = 0) | 14 | 10 | 1 |
| 30 KHz (u = 1) | 14 | 20 | 2 |
| 60 KHz (u = 2) | 14 | 40 | 4 |
| 120 KHz (u = 3) | 14 | 80 | 8 |
| 240 KHz (u = 4) | 14 | 160 | 16 |

Table 2 below lists the number of symbols per slot, the number of slots per frame, and the number of slots per subframe according to an SCS in the ECP case.

TABLE 2

| SCS (15*2^u) | $N^{slot}_{symb}$ | $N^{frame,u}_{slot}$ | $N^{subframe,u}_{slot}$ |
|---|---|---|---|
| 60 KHz (u = 2) | 12 | 40 | 4 |

In the NR system, different OFDM(A) numerologies (e.g., SCSs, CP lengths, and so on) may be configured for a plurality of cells aggregated for one UE. Accordingly, the (absolute time) duration of a time resource including the same number of symbols (e.g., a subframe, slot, or TTI) (collectively referred to as a time unit (TU) for convenience) may be configured to be different for the aggregated cells.

In NR, various numerologies or SCSs may be supported to support various 5G services. For example, with an SCS of 15 kHz, a wide area in traditional cellular bands may be supported, while with an SCS of 30 kHz/60 kHz, a dense urban area, a lower latency, and a wide carrier bandwidth may be supported. With an SCS of 60 kHz or higher, a bandwidth larger than 24.25 GHz may be supported to overcome phase noise.

An NR frequency band may be defined by two types of frequency ranges, FR1 and FR2. The numerals in each frequency range may be changed. For example, the two types of frequency ranges may be given in Table 3. In the NR system, FR1 may be a "sub 6 GHz range" and FR2 may be an "above 6 GHz range" called millimeter wave (mmW).

TABLE 3

| Frequency Range designation | Corresponding frequency range | Subcarrier Spacing (SCS) |
|---|---|---|
| FR1 | 450 MHz-6000 MHz | 15, 30, 60 kHz |
| FR2 | 24250 MHz-52600 MHz | 60, 120, 240 kHz |

As mentioned above, the numerals in a frequency range may be changed in the NR system. For example, FR1 may range from 410 MHz to 7125 MHz as listed in Table 4. That is, FR1 may include a frequency band of 6 GHz (or 5850, 5900, and 5925 MHz) or above. For example, the frequency band of 6 GHz (or 5850, 5900, and 5925 MHz) or above may include an unlicensed band. The unlicensed band may be used for various purposes, for example, vehicle communication (e.g., autonomous driving).

TABLE 4

| Frequency Range designation | Corresponding frequency range | Subcarrier Spacing (SCS) |
|---|---|---|
| FR1 | 410 MHz-7125 MHz | 15, 30, 60 kHz |
| FR2 | 24250 MHz-52600 MHz | 60, 120, 240 kHz |

Figure 7:
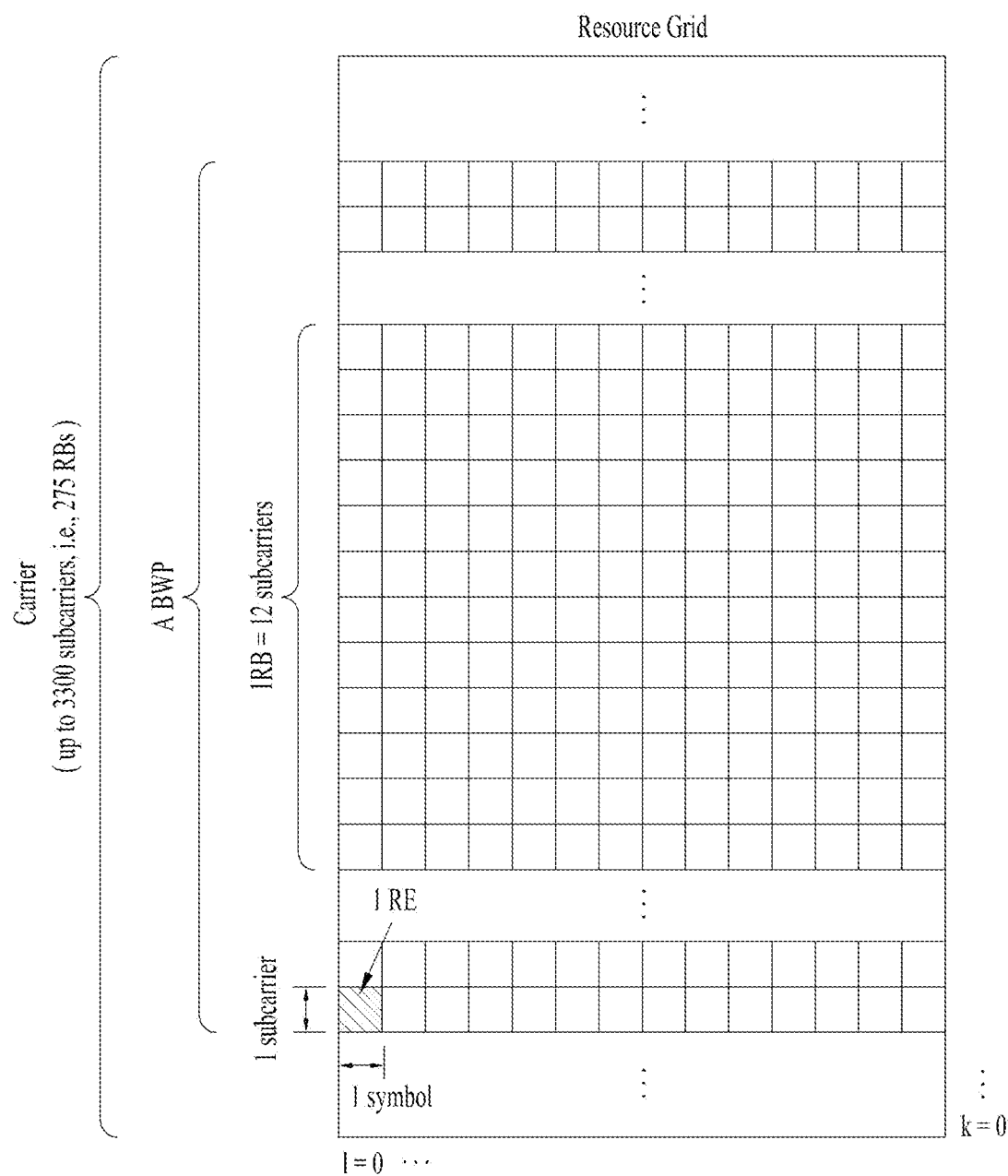
FIG. 7 illustrates a slot structure in an NR frame according to an embodiment of the present disclosure.

FIG. 7 illustrates a slot structure in an NR frame according to an embodiment of the present disclosure.

Referring to FIG. 7, a slot includes a plurality of symbols in the time domain. For example, one slot may include 14 symbols in an NCP case and 12 symbols in an ECP case. Alternatively, one slot may include 7 symbols in an NCP case and 6 symbols in an ECP case.

A carrier includes a plurality of subcarriers in the frequency domain. An RB may be defined by a plurality of (e.g., 12) consecutive subcarriers in the frequency domain. A bandwidth part (BWP) may be defined by a plurality of consecutive (physical) RBs ((P)RBs) in the frequency domain and correspond to one numerology (e.g., SCS, CP length, or the like). A carrier may include up to N (e.g., 5) BWPs. Data communication may be conducted in an activated BWP. Each element may be referred to as a resource element (RE) in a resource grid, to which one complex symbol may be mapped.

A radio interface between UEs or a radio interface between a UE and a network may include L1, L2, and L3. In various embodiments of the present disclosure, L1 may refer to the PHY layer. For example, L2 may refer to at least one of the MAC layer, the RLC layer, the PDCH layer, or the SDAP layer. For example, L3 may refer to the RRC layer.

Now, a description will be given of sidelink (SL) communication.

Figure 8A:
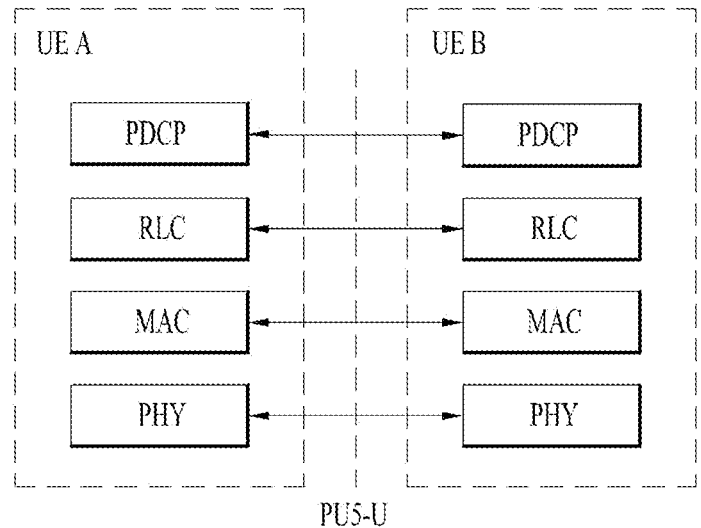
FIGS. 8A and 8B illustrate a radio protocol architecture for SL communication according to an embodiment of the present disclosure.
Figure 8B:
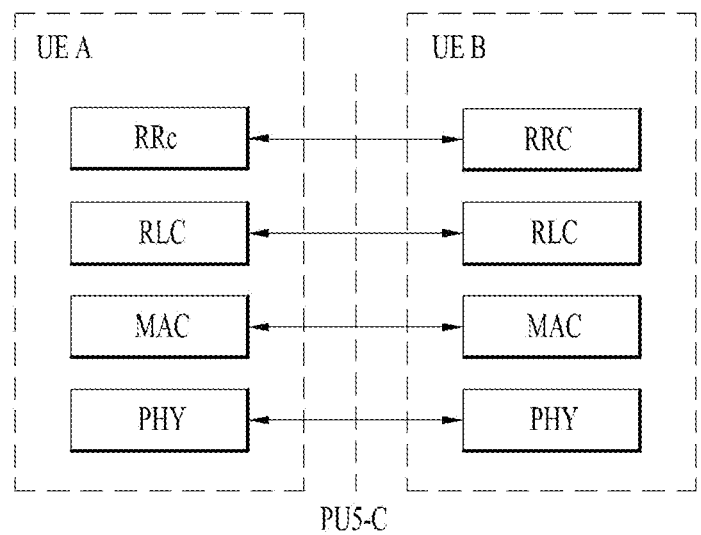

FIGS. 8A and 8B illustrate a radio protocol architecture for SL communication according to an embodiment of the present disclosure. Specifically, FIG. 8A illustrates a user-plane protocol stack in LTE, and FIG. 8B illustrates a control-plane protocol stack in LTE.

Figure 9A:
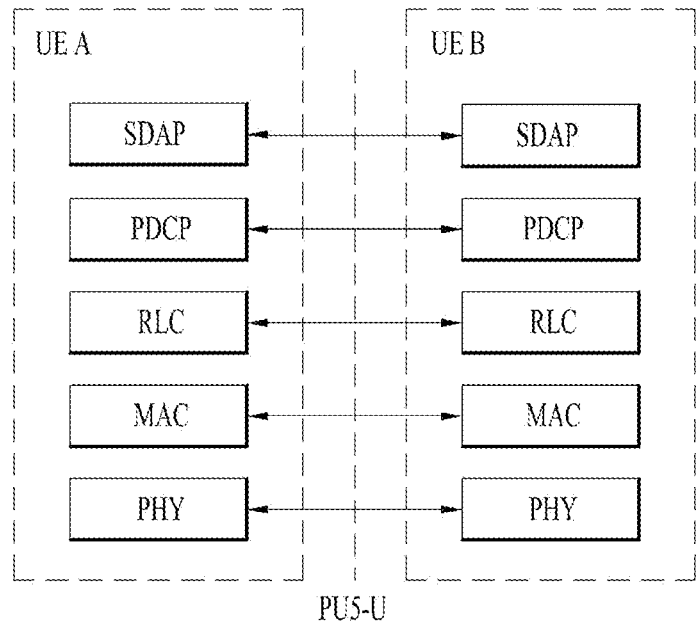
FIGS. 9A and 9B illustrate a radio protocol architecture for SL communication according to an embodiment of the present disclosure.
Figure 9B:
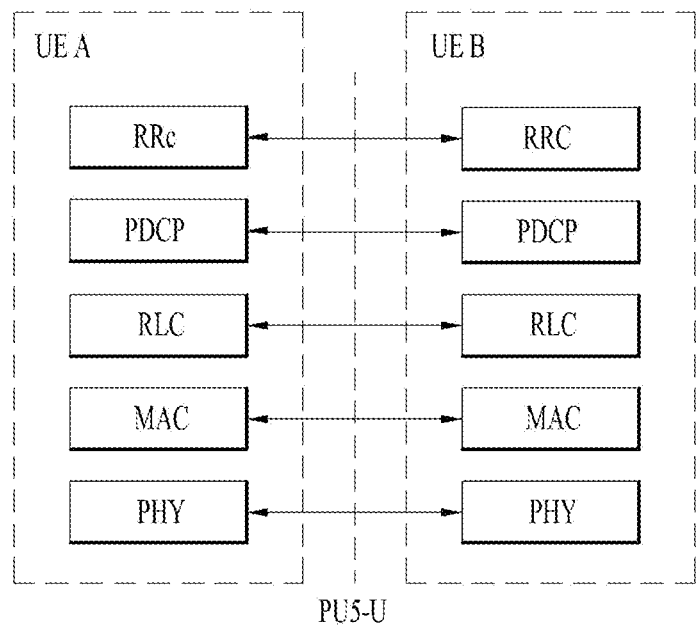

FIGS. 9A and 9B illustrate a radio protocol architecture for SL communication according to an embodiment of the present disclosure. Specifically, FIG. 9A illustrates a user-plane protocol stack in NR, and FIG. 9B illustrates a control-plane protocol stack in NR.

Resource allocation in SL will be described below.

Figure 10A:
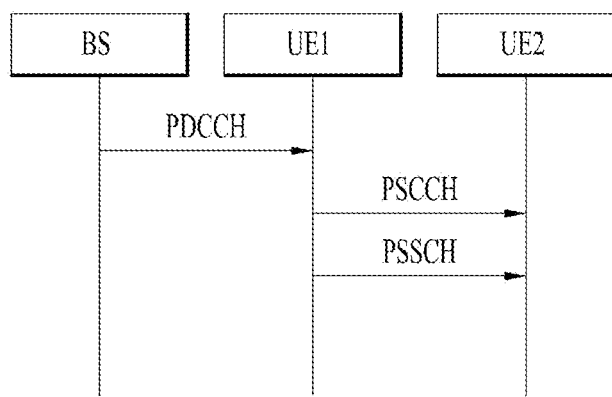
FIGS. 10A and 10B illustrate a procedure of performing V2X or SL communication according to a transmission mode in a UE according to an embodiment of the present disclosure.
Figure 10B:
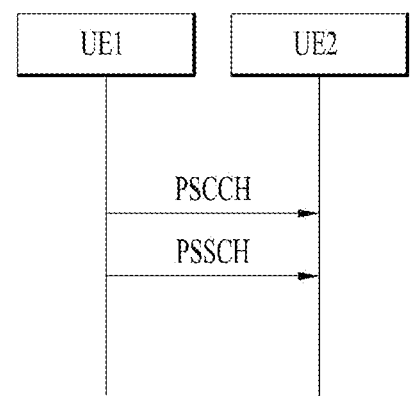

FIGS. 10A and 10B illustrate a procedure of performing V2X or SL communication according to a transmission mode in a UE according to an embodiment of the present disclosure. In various embodiments of the present disclosure, a transmission mode may also be referred to as a mode or a resource allocation mode. For the convenience of description, a transmission mode in LTE may be referred to as an LTE transmission mode, and a transmission mode in NR may be referred to as an NR resource allocation mode.

For example, FIG. 10A illustrates a UE operation related to LTE transmission mode 1 or LTE transmission mode 3. Alternatively, for example, FIG. 10A illustrates a UE operation related to NR resource allocation mode 1. For example, LTE transmission mode 1 may be applied to general SL communication, and LTE transmission mode 3 may be applied to V2X communication.

For example, FIG. 10B illustrates a UE operation related to LTE transmission mode 2 or LTE transmission mode 4. Alternatively, for example, FIG. 10B illustrates a UE operation related to NR resource allocation mode 2.

Referring to FIG. 10A, in LTE transmission mode 1, LTE transmission mode 3, or NR resource allocation mode 1, a BS may schedule SL resources to be used for SL transmission of a UE. For example, the BS may perform resource scheduling for UE1 through a PDCCH (more specifically, DL control information (DCI)), and UE1 may perform V2X or SL communication with UE2 according to the resource scheduling. For example, UE1 may transmit sidelink control information (SCI) to UE2 on a PSCCH, and then transmit data based on the SCI to UE2 on a PSSCH.

For example, in NR resource allocation mode 1, a UE may be provided with or allocated resources for one or more SL transmissions of one transport block (TB) by a dynamic grant from the BS. For example, the BS may provide the UE with resources for transmission of a PSCCH and/or a PSSCH by the dynamic grant. For example, a transmitting UE may report an SL hybrid automatic repeat request (SL HARQ) feedback received from a receiving UE to the BS. In this case, PUCCH resources and a timing for reporting the SL HARQ feedback to the BS may be determined based on an indication in a PDCCH, by which the BS allocates resources for SL transmission.

For example, the DCI may indicate a slot offset between the DCI reception and a first SL transmission scheduled by the DCI. For example, a minimum gap between the DCI that schedules the SL transmission resources and the resources of the first scheduled SL transmission may not be smaller than a processing time of the UE.

For example, in NR resource allocation mode 1, the UE may be periodically provided with or allocated a resource set for a plurality of SL transmissions through a configured grant from the BS. For example, the grant to be configured may include configured grant type 1 or configured grant type 2. For example, the UE may determine a TB to be transmitted in each occasion indicated by a given configured grant.

For example, the BS may allocate SL resources to the UE in the same carrier or different carriers.

For example, an NR gNB may control LTE-based SL communication. For example, the NR gNB may transmit NR DCI to the UE to schedule LTE SL resources. In this case, for example, a new RNTI may be defined to scramble the NR DCI. For example, the UE may include an NR SL module and an LTE SL module.

For example, after the UE including the NR SL module and the LTE SL module receives NR SL DCI from the gNB, the NR SL module may convert the NR SL DCI into LTE DCI type 5A, and transmit LTE DCI type 5A to the LTE SL module every Xms. For example, after the LTE SL module receives LTE DCI format 5A from the NR SL module, the LTE SL module may activate and/or release a first LTE subframe after Z ms. For example, X may be dynamically indicated by a field of the DCI. For example, a minimum value of X may be different according to a UE capability. For example, the UE may report a single value according to its UE capability. For example, X may be positive.

Referring to FIG. 10B, in LTE transmission mode 2, LTE transmission mode 4, or NR resource allocation mode 2, the UE may determine SL transmission resources from among SL resources preconfigured or configured by the BS/network. For example, the preconfigured or configured SL resources may be a resource pool. For example, the UE may autonomously select or schedule SL transmission resources. For example, the UE may select resources in a configured resource pool on its own and perform SL communication in the selected resources. For example, the UE may select resources within a selection window on its own by a sensing and resource (re)selection procedure. For example, the sensing may be performed on a subchannel basis. UE1, which has autonomously selected resources in a resource pool, may transmit SCI to UE2 on a PSCCH and then transmit data based on the SCI to UE2 on a PSSCH.

For example, a UE may help another UE with SL resource selection. For example, in NR resource allocation mode 2, the UE may be configured with a grant configured for SL transmission. For example, in NR resource allocation mode 2, the UE may schedule SL transmission for another UE. For example, in NR resource allocation mode 2, the UE may reserve SL resources for blind retransmission.

For example, in NR resource allocation mode 2, UE1 may indicate the priority of SL transmission to UE2 by SCI. For example, UE2 may decode the SCI and perform sensing and/or resource (re)selection based on the priority. For example, the resource (re)selection procedure may include identifying candidate resources in a resource selection window by UE2 and selecting resources for (re)transmission from among the identified candidate resources by UE2. For example, the resource selection window may be a time interval during which the UE selects resources for SL transmission. For example, after UE2 triggers resource (re)selection, the resource selection window may start at T1≥0, and may be limited by the remaining packet delay budget of UE2. For example, when specific resources are indicated by the SCI received from UE1 by the second UE and an L1 SL reference signal received power (RSRP) measurement of the specific resources exceeds an SL RSRP threshold in the step of identifying candidate resources in the resource selection window by UE2, UE2 may not determine the specific resources as candidate resources. For example, the SL RSRP threshold may be determined based on the priority of SL transmission indicated by the SCI received from UE1 by UE2 and the priority of SL transmission in the resources selected by UE2.

For example, the L1 SL RSRP may be measured based on an SL demodulation reference signal (DMRS). For example, one or more PSSCH DMRS patterns may be configured or preconfigured in the time domain for each resource pool. For example, PDSCH DMRS configuration type 1 and/or type 2 may be identical or similar to a PSSCH DMRS pattern in the frequency domain. For example, an accurate DMRS pattern may be indicated by the SCI. For example, in NR resource allocation mode 2, the transmitting UE may select a specific DMRS pattern from among DMRS patterns configured or preconfigured for the resource pool.

For example, in NR resource allocation mode 2, the transmitting UE may perform initial transmission of a TB without reservation based on the sensing and resource (re)selection procedure. For example, the transmitting UE may reserve SL resources for initial transmission of a second TB using SCI associated with a first TB based on the sensing and resource (re)selection procedure.

For example, in NR resource allocation mode 2, the UE may reserve resources for feedback-based PSSCH retransmission through signaling related to a previous transmission of the same TB. For example, the maximum number of SL resources reserved for one transmission, including a current transmission, may be 2, 3 or 4. For example, the maximum number of SL resources may be the same regardless of whether HARQ feedback is enabled. For example, the maximum number of HARQ (re)transmissions for one TB may be limited by a configuration or preconfiguration. For example, the maximum number of HARQ (re)transmissions may be up to 32. For example, if there is no configuration or preconfiguration, the maximum number of HARQ (re)transmissions may not be specified. For example, the configuration or preconfiguration may be for the transmitting UE. For example, in NR resource allocation mode 2, HARQ feedback for releasing resources which are not used by the UE may be supported.

For example, in NR resource allocation mode 2, the UE may indicate one or more subchannels and/or slots used by the UE to another UE by SCI. For example, the UE may indicate one or more subchannels and/or slots reserved for PSSCH (re)transmission by the UE to another UE by SCI. For example, a minimum allocation unit of SL resources may be a slot. For example, the size of a subchannel may be configured or preconfigured for the UE.

SCI will be described below.

While control information transmitted from a BS to a UE on a PDCCH is referred to as DCI, control information transmitted from one UE to another UE on a PSCCH may be referred to as SCI. For example, the UE may know the starting symbol of the PSCCH and/or the number of symbols in the PSCCH before decoding the PSCCH. For example, the SCI may include SL scheduling information. For example, the UE may transmit at least one SCI to another UE to schedule the PSSCH. For example, one or more SCI formats may be defined.

For example, the transmitting UE may transmit the SCI to the receiving UE on the PSCCH. The receiving UE may decode one SCI to receive the PSSCH from the transmitting UE.

For example, the transmitting UE may transmit two consecutive SCIs (e.g., 2-stage SCI) on the PSCCH and/or PSSCH to the receiving UE. The receiving UE may decode the two consecutive SCIs (e.g., 2-stage SCI) to receive the PSSCH from the transmitting UE. For example, when SCI configuration fields are divided into two groups in consideration of a (relatively) large SCI payload size, SCI including a first SCI configuration field group is referred to as first SCI. SCI including a second SCI configuration field group may be referred to as second SCI. For example, the transmitting UE may transmit the first SCI to the receiving UE on the PSCCH. For example, the transmitting UE may transmit the second SCI to the receiving UE on the PSCCH and/or PSSCH. For example, the second SCI may be transmitted to the receiving UE on an (independent) PSCCH or on a PSSCH in which the second SCI is piggybacked to data. For example, the two consecutive SCIs may be applied to different transmissions (e.g., unicast, broadcast, or groupcast).

For example, the transmitting UE may transmit all or part of the following information to the receiving UE by SCI. For example, the transmitting UE may transmit all or part of the following information to the receiving UE by first SCI and/or second SCI.

PSSCH-related and/or PSCCH-related resource allocation information, for example, the positions/number of time/frequency resources, resource reservation information (e.g. a periodicity), and/or
  an SL channel state information (CSI) report request indicator or SL (L1) RSRP (and/or SL (L1) reference signal received quality (RSRQ) and/or SL (L1) received signal strength indicator (RSSI)) report request indicator, and/or
  an SL CSI transmission indicator (on PSSCH) (or SL (L1) RSRP (and/or SL (L1) RSRQ and/or SL (L1) RSSI) information transmission indicator), and/or
  MCS information, and/or
  transmission power information, and/or
  L1 destination ID information and/or L1 source ID information, and/or
  SL HARQ process ID information, and/or
  new data indicator (NDI) information, and/or
  redundancy version (RV) information, and/or
  QoS information (related to transmission traffic/packet), for example, priority information, and/or
  an SL CSI-RS transmission indicator or information about the number of SL CSI-RS antenna ports (to be transmitted);

location information about a transmitting UE or location (or distance area) information about a target receiving UE (requested to transmit an SL HARQ feedback), and/or RS (e.g., DMRS or the like) information related to decoding and/or channel estimation of data transmitted on a PSSCH, for example, information related to a pattern of (time-frequency) mapping resources of the DMRS, rank information, and antenna port index information.

For example, the first SCI may include information related to channel sensing. For example, the receiving UE may decode the second SCI using the PSSCH DMRS. A polar code used for the PDCCH may be applied to the second SCI. For example, the payload size of the first SCI may be equal for unicast, groupcast and broadcast in a resource pool. After decoding the first SCI, the receiving UE does not need to perform blind decoding on the second SCI. For example, the first SCI may include scheduling information about the second SCI.

In various embodiments of the present disclosure, since the transmitting UE may transmit at least one of the SCI, the first SCI, or the second SCI to the receiving UE on the PSCCH, the PSCCH may be replaced with at least one of the SCI, the first SCI, or the second SC. Additionally or alternatively, for example, the SCI may be replaced with at least one of the PSCCH, the first SCI, or the second SCI. Additionally or alternatively, for example, since the transmitting UE may transmit the second SCI to the receiving UE on the PSSCH, the PSSCH may be replaced with the second SCI.

The PUSCH/PDSCH sequence in the NR system may be initialized as follows according to Equations 1 and 2 below. (TS 38.211)

$$c_{init} = n_{RNTI} \cdot 2^{15} + n_{ID} \quad \text{[Equation 1]}$$

$$c_{init} = n_{RNTI} \cdot 2^{15} + q \cdot 2^{14} + n_{ID} \quad \text{[Equation 2]}$$

In the above equations, $n_{ID}$ may be a higher-layer parameter limited to a UE-specific search space scheduled for unicast with DCI, and in this case, may have a value of $\{0,1, \ldots ,1023\}$. In other cases, $n_{ID}$ may be given by $\{0,1, \ldots ,1007\}$ as a Cell ID. In a conventional LTE system, $n_{ID}$ in the case of Uu may be fixed to $\{0,1, \ldots 503\}$ as a Cell ID value, and in SL, $n_{ID}$ may be fixed to an initial value that is 510 to distinguish from Uu.

If a method used in a PD(U)CCH and a PD(U)SCH of a conventional NR Uu is used without change when scrambling sequences of the PSCCH and the PSSCH are generated to effectively transmit a resource in NR SL, there is a problem in that it is difficult to distinguish between NR SL and NR Uu UEs. Accordingly, hereinafter, an embodiment of the present disclosure proposes a method of generating a scrambling sequence in NR SL and an apparatus for supporting the method.

According to an embodiment, a 1st sidelink control information (SCI) may be transmitted on a PSCCH and 2nd stage SCI may be transmitted on a PSSCH. Here, a first scrambling sequence related to the 1st stage SCI may be generated based on a fixed value, and a second scrambling sequence related to the 2nd stage SCI may be generated based on a cyclic redundancy check (CRC) related value. The CRC related value may be derived from CRC on the PSCCH. The fixed value may be related to initialization of the first scrambling sequence, and the CRC of the PSCCH may be related to initialization of the second scrambling sequence.

That is, the 1st SCI may be determined using an initial value of a scrambling sequence, and although the 2nd SCI is control information, the 2nd SCI may be determined using the CRC of the scrambling sequence differently from the 1st SCI. Since the 1st SCI needs to be received by all UEs, a fixed value may be used, but since the 2nd SCI is for a specific UE, CRC needs to be used, and thus different scrambling sequences may be used according to a type of SCI. That is, the initial value of the scrambling sequence may be determined in consideration of the characteristics/target of UEs that receive different types of SCI, and thus randomization of the 2nd SCI may be effectively performed.

Based on an initialization method in an LTE system and an initialization method in an NR Uu, the following may be considered during initialization in NR SL.

Since $n_{ID}$ ranges from 0 to 1023 in NR Uu, it may not be possible to distinguish a scrambling sequence between NR Uu and NR SL by fixing $n_{ID}$ to 510, which is a specific value in LTE SL, in NR SL. Thus, $n_{ID}$ in NR SL needs to be a value equal to or greater than 1024 (2^10) greater than 1023 that is currently used in NR Uu. In Equation 1, a value equal to or less than 2^15–1 needs to be used. That is, some values of $\{1024, \ldots 32767\}$ may be (pre)configured or predefined to $n_{ID}$ in NR SL. In this case, UEs may assume that an $n_{ID}$ value used in NR SL is not used in NR Uu. In another example, like in LTE SL, a specific value (e.g., 1030) may be fixed to an initial value in NR SL. In another example, in NR Uu, a specific value (some values of $\{1008, \ldots ,1023\}$) of $n_{ID}$ may be used for SL. In this case, UEs may assume that $n_{ID}$ used in NR SL is not used in NR Uu. In another example, an ID (15 bits) used in NR Uu may be divided and used in NR sidelink, and a value except for the corresponding ID may be used in NR sidelink. For example, $\{0, \ldots ,16383\}$ that is half of IDs of $\{0, \ldots , 32767\}$ may be used in NR Uu, and $\{16383, \ldots 32767\}$ that is the other half may be used in NR sidelink. Alternatively, X % of IDs of $\{0, \ldots , 32767\}$ may be used in NR Uu, and (100−X) % thereof may be used in NR sidelink. In another example, $\{0, \ldots , 32767\}$ may be used in NR Uu, and $\{32767, \ldots , 65536+2\Lambda(\text{the sum of bits used in destination group ID and destination ID})\}$ may be used in NR sidelink.

When sensing operating is considered in the case of a PSCCH, all UEs need to perform decoding, and thus an $n_{ID}$ value may be fixed for each UE or may be (pre)configured for each resource pool.

In the case of a PSSCH, all UEs may not need to perform decoding, and only a UE based on the corresponding ID (e.g. a destination ID) may perform decoding. In Equations 1 and 2, an $n_{RNTI}$ value may be
  1) Destination ID,
  2) concatenation of Source ID and Destination ID,
  3) CRC value of corresponding SCI, or the like.

In this case, in the case of CRC, truncation may be required, and when a single ID is used, zero padding may be required. Alternatively, considering that a PSSCH resource is implicitly linked to the PSCCH, an $n_{ID}$ value used in the PSCCH may be inherited. Alternatively, when an $n_{ID}$ value is configured using a source ID, it may be assumed that an $n_{ID}$ value used in NR SL is not used in NR Uu to distinguish between NR Uu and NR SL as described above.

Like in the above case, an initialization method needs to also be considered when a CSI-RS sequence is generated in NR SL. Currently, in an NR system, a CSI-RS sequence may be initialized using Equation 3 below. (TS 38.211)

$$c_{init} = (2^{10}(N_{symb}^{slot} n_{s,f}^{\mu} + l + 1)(2n_{ID}+1) + n_{ID}) \bmod 2^{31} \quad \text{[Equation 3]}$$

In the above equation, $n_{ID}$ may be a higher layer signaled value (scramblingID or sequenceGenerationConfig) and may have a value of $\{0,1, \ldots ,1023\}$. First, 1) $n_{ID}$ may be configured based on a source ID and may be considered as the following combination. 2) $n_{ID}$ may be configured using a Source ID and a destination ID LSB. Alternatively, 3) A rate of bits of the source ID and the destination LSB may be adjusted while the sum of bits of the source ID and the destination ID LSB is maintained constant. Hereinafter, embodiments of the above 1), 2), and 3) will be described.

Source ID 8 bits

Source ID 8 bits+Destination ID LSB 2 bits

Source ID LSB X bits+Destination ID LSB Y bits. (X+Y=10 bits)

When an NR SL CSI-RS sequence is generated, randomization with an NR SL CSI-RS and randomization between NR SL UEs may be required. Thus, when the NR SL CSI-RS sequence is generated, an $n_{ID}$ value may be (pre)configured or predefined. For example, a value greater than 1023 may be (pre)configured or predefined as an $n_{ID}$ value for randomization with NR Uu. In consideration of sequence randomization between CSI-RS transmissions of NR SL UEs, CRC values of a PSCCH related to different PSSCH transmissions that partially or completely overlap in the same resource may be used to derive an $n_{ID}$ value. That is, in order to derive the $n_{ID}$ value, 1) Destination ID, 2) concatenation of Source ID and Destination ID, 3) CRC value of corresponding SCI, or the like may be used. In this case, in the case of CRC, truncation may be required, and when a single ID is used, zero padding may be required.

For example, (the aforementioned) method for sequence generation may also be applied in the same or similar way in order to generate a sequence of a PT-RS. That is, for example, for sequence generation and/or randomization, (during sequence generation, some) parameters may be (pre)configured or predefined. CRC values of a PSCCH related to different PSSCH transmissions that partially or completely overlap in the same resource may be used for sequence randomization. That is, for PT-RS sequence generation and/or randomization, 1) Destination ID, 2) concatenation of Source ID and Destination ID, 3) CRC value of corresponding SCI, or the like may be used. In this case, in the case of CRC, truncation may be required, and when a single ID is used, zero padding may be required.

In this case, among conditions (used to derive the aforementioned $n_{RNTI}$ and $n_{ID}$ values), 1) Destination ID 2) concatenation of Source ID and Destination ID, and 3) CRC value of corresponding SCI may be interpreted extensively by the use of only destination ID information or source ID information for generation and/or randomization of a sequence (e.g., a PSCCH/PSSCH DMRS, PSCCH/PSSCH scrambling, a CSI-RS, and/or a PT-RS), the use of a combination of the source ID and the destination ID, and/or the use of some bits of CRC (e.g., some bits of LSB (e.g., 2 bits) or some bits of LSB except for bits used for randomization of other sequences (e.g., a PSCCH/PSSCH DMRS, PSCCH/PSSCH scrambling, a CSI-RS, and/or a PT-RS).

As an example of (the aforementioned) PSCCH/PSSCH scrambling sequence generation, $c_{init}=n_{RNTI}\cdot 2^{15}+n_{ID}$ may be used for initialization when the corresponding sequence is generated.

In the case of a PSCCH in the above equation, (since all UEs need to perform decoding) an $n_{RNTI}$ value may be fixed to one value (e.g., 0). Alternatively, the $n_{RNTI}$ value may be (pre)configured. Alternatively, the $n_{RNTI}$ value may be configured based on a PSCCH OCC index value. For example, some bits (e.g., 2, 3, or 4 bits) may be configured based on the PSCCH OCC index, and the other bits may be (pre)configured. In another example, one value may be selected among 16-bit $n_{RNTI}$ value candidates that are (pre)configured based on the PSCCH OCC index. In the case of $n_{ID}$, one value of {1008, . . . , 32767} (or {1024, . . . , 32767}) may be differently (or independently) configured specifically to a resource pool (a service type/priority, a (service) QoS parameter (e.g., reliability or latency), MCS, a UE (absolute or relative) speed, a sub-channel size, and/or a scheduled frequency resource domain size) (by a network/BS).

In the case of a PSSCH in the above equation, in order to derive an $n_{RNTI}$ value, only destination ID information or source ID information may be used, a combination of the source ID and the destination ID may be used, some bits of PSCCH CRC (e.g., 16 bit LSB) may be used, a concatenation (e.g., $1^{st}$ SCI CRC 8 bit LSB+$2^{nd}$ SCI CRC 8 bit LSB) value of some bits of PSCCH ($1^{st}$ SCI) CRC and $2^{nd}$ SCI CRC may be used, and/or an XOR value of some bits of $1^{st}$ SCI CRC and $2^{nd}$ SCI CRC may be used. Alternatively, the $n_{RNTI}$ value may be (pre)configured. Alternatively, the $n_{RNTI}$ value may be configured based on a PSCCH OCC index value. For example, based on the PSCCH OCC index, some bit (e.g., 2, 3, or 4 bits) values may be configured, and the other bits may be (pre)configured. In another example, one value may be selected among 16 bit $n_{RNTI}$ value candidates that are (pre)configured based on the PSCCH OCC index. In the case of $n_{ID}$, one value of {1008, . . . , 32767} (or {1024, . . . , 32767}) may be differently (or independently) configured specifically to a resource pool (a service type/priority, a (service) QoS parameter (e.g., reliability or latency), MCS, a UE (absolute or relative) speed, a sub-channel size, and/or a scheduled frequency resource domain size) (by a network/BS).

In the case of $2^{nd}$ SCI in the above equation, in order to derive an $n_{RNTI}$ value, some bits of PSCCH ($1^{st}$ SCI) CRC (e.g., 16 bit LSB) may be used. Alternatively, the $n_{RNTI}$ value may be (pre)configured. Alternatively, the $n_{RNTI}$ value may be configured based on a PSCCH OCC index value. For example, one value may be selected among 16 bit $n_{RNTI}$ value candidates that are (pre)configured based on the PSCCH OCC index.

In the above description, an $n_{RNTI}$ value linked by the PSSCH and/or a PSCCH OCC index applied to $2^{nd}$ SCI may be differently configured from the $n_{RNTI}$ value linked by the PSCCH OCC index applied to the PSCCH.

In the above description, in the case of a PSCCH, a PSSCH, and/or $2^{nd}$ SCI, configuration of derivation of the $n_{RNTI}$ based on the PSCCH OCC index may be interpreted extensively by a method of replacing $n_{RNTI}$ with a PSCCH OCC index (e.g., 2, 3, or 4 bits) (e.g., a form in which the number of $n_{RNTI}$ bits is reduced) or a method of filling the remaining bits with a predefined/fixed specific value (e.g., 0) other than the bit derived from the PSCCH OCC index (e.g., 2, 3, or 4 bits) (i.e., a method in which the remaining bits are not (pre-)configured).

In the present disclosure, as an example of PSCCH scrambling sequence generation, $c_{init}=n_{RNTI}\cdot 2^{16}+n_{ID}$ may be used for initialization when the corresponding sequence is generated.

When the PSSCH scrambling sequence is configured, an $n_{ID}$ value may be derived using, for example, some bits (e.g., 16 bit LSB) of PSCCH CRC and/or an $n_{RNTI}$ value may be fixed (or preconfigured) to one value (e.g., 0). In another example, the $n_{ID}$ value may be the same as the $n_{ID}$ value configured when the PSCCH scrambling sequence is generated.

According to the present disclosure, the PSSCH may be extensively interpreted by $2^{nd}$ SCI or SL-SCH.

As an example of (the aforementioned) PSCCH DMRS sequence generation, $c_{init}=(2^{17}(N_{symb}^{slot}n_{s,f}^{\mu}+l+1)(2N_{ID}+1)+2N_{ID}+n_{SCID})$ mod $2^{31}$ may be used for initialization when the corresponding sequence is generated.

One value of $\{0, 1\}$ may be selected as $n_{SCID}$ in the above equation by a TX UE. In the case of $N_{ID}$, one value of $\{1008, \ldots, 65535\}$ may be differently (or independently) configured specifically to a resource pool (a service type/priority, a (service) QoS parameter (e.g., reliability or latency), MCS, a UE (absolute or relative) speed, a sub-channel size, and/or a scheduled frequency resource domain size) (by a network/BS). In the above example, $n_{SCID}$ is assumed to use 1 bit, but more bits (e.g., 2 bits or more) may be used. In this case, a range of a value to be selected as an $N_{ID}$ value may also be changed depending on a bit number used in $n_{SCID}$. (For example, when $n_{SCID}$ uses 2 bits, one value of $\{0, 1, 2, 3\}$ may be selected as $n_{SCID}$ by a TX UE, and in the case of $N_{ID}$, one value of $\{1008, \ldots, 32767\}$ may be differently (or independently) configured specifically to a resource pool (a service type/priority, a (service) QoS parameter (e.g., reliability or latency), MCS, a UE (absolute or relative) speed, a sub-channel size, and/or a scheduled frequency resource domain size) (by a network/BS.) In this case, a $c_{init}$ value needs to be also changed depending on a value (or a value range) to be selected as $n_{SCID}$ or $N_{ID}$. For example, in the case of (the aforementioned) $n_{SCID} \in \{0,1,2,3\}$, $N_{ID} \in \{1008, \ldots, 32767\}$, $c_{init}=(2^{17}(N_{symb}^{slot}n_{s,f}^{\mu}+l+1)(2N_{ID}+1)+2^2N_{ID}+n_{SCID})$ mod $2^{31}$ may be satisfied.

As an example of (the aforementioned) PSSCH DMRS sequence generation, $c_{init}=(2^{17}(N_{symb}^{slot}n_{s,f}^{\mu}+l+1)(2N_{ID}^{nSCID}+1)+2N_{ID}^{nSCID}n_{SCID})$ mod $2^{31}$ may be used for initialization when the corresponding sequence is generated.

In order to derive one value of $\{0, 1\}$, $n_{SCID}$ in the above equation may use some bits (e.g., 1 bit LSB) of PSCCH CRC may be used. In order to derive one value of $\{1008, \ldots, 65535\}$, $N_{ID}^0$ and $N_{ID}^1$ may use some bits (e.g., 14 bit LSB (after 1 bit LSB used in $n_{SCID}$) of PSCCH CRC. In the above example, $n_{SCID}$ is assumed to use 1 bit, but more (e.g., 2 bits or more) may be used. In this case, a range of a value to be selected as an $N_{ID}^{nSCID}$ value may also be changed depending on a bit number used in $n_{SCID}$. (For example, when $n_{SCID}$ uses 2 bits, $n_{SCID}$ may use some bits (e.g., 2 bit LSB) of PSCCH CRC in order to derive one value of $\{0, 1, 2, 3\}$. $N_{ID}^0$ and $N_{ID}^1$ may use some bits (e.g., after 2 bit LSB used in $n_{SCID}$) of PSCCH CRC in order to derive one value of $\{1008, \ldots, 32767\}$. In this case, a $c_{init}$ value needs to be also changed depending on a value (or a value range) to be selected as $n_{SCID}$ or $N_{ID}^{nSCID}$.

The (aforementioned) term (PSCCH) CRC used during PSSCH scrambling and/or PSSCH DMRS (base) sequence generation and/or used during SL-CSI-RS (base) sequence and/or PT-RS (base) sequence generation may be interpreted extensively by $2^{nd}$ SCI CRC (a combination of $1^{st}$ SCI CRC, L1-destination ID, L1-source ID, $1^{st}$ SCI CRC, $2^{nd}$ SCI CRC, L1-destination ID, and/or L1-source ID).

1.1.1. Bandwidth Part

To avoid RF switching delay, it is assumed that the numerology of configured SL BWP is the same as that of active UL BWP in the same carrier at a given time. Next, it can be further considered that RF retuning is not needed to switch between active UL BWP and configured SL BWP. In other words, it can be considered that UE's RF setting covers both active UL BWP and configured SL BWP. In this case even though SL BWP and active UL BWP have different center frequency of BWP and BWP size, UE may not apply the switching delay.

Meanwhile, in NR Uu link, for the uplink, the higher-layer parameter txDirectCurrentLocation indicates the location of the transmitter DC subcarrier in the uplink for a bandwidth part, including whether the DC subcarrier location is offset by 7.5 kHz relative to the center of the indicated subcarrier or not. Considering that UE's RF setting covers both active UL BWP and configured SL BWP, the DC subcarrier location for the sidelink needs to be the same as that of the uplink. On the other hand, for out-of-coverage UE or idle UE, the DC subcarrier location for the sidelink could be (pre)configured per SL BWP.

To avoid RF switching delay, the UE expects the same location of DC subcarrier between UL BWP and SL BWP in a given time. In this case, SL BWP and UL BWP have different (or same) RF bandwidth, and SL BWP and UL BWP may be set at different locations within the different (or same) RF bandwidth. On the other hand, when the RF bandwidth and the location of DC subcarrier of UL BWP is determined, it can be considered UE expects that the configured SL BWP is deactivated if the location of DC subcarrier of SL BWP has different location with the configured location of DC subcarrier of UL BWP.

Proposal 1: TX DC subcarrier in the sidelink is (pre)configured per SL BWP.

Proposal 3: UE expects to use a same DC subcarrier location in the SL BWP and in an active UL BWP in a same carrier of a same cell.

If the DC subcarrier location of the active UL BWP is different than the DC subcarrier location of the SL BWP, the SL BWP is deactivated.

Regarding active DL BWP, for paired spectrum, it can be taken into account that separate RF chains between active DL BWP and configured SL BWP as in LTE V2X. On the other hand, for unpaired spectrum, it can be assumed that UE's RF setting covers both active DL BWP and configured SL BWP together with active UL BWP. Note that, in NR Uu link, for unpaired spectrum, UE expects that the center frequency of active DL BWP is aligned with that of active UL BWP and the same numerology is used for the active DL BWP and the active UL BWP.

1.1.2. Resource Pool

In RAN1 #98bis meeting [1] and RAN1 #99 meeting [2], followings are agreed for resource pool in time domain:

Agreements:

A slot is the time-domain granularity for resource pool configuration.
  To down-select:
    Alt 1. Slots for a resource pool is (pre-)configured with bitmap, which is applied with periodicity
    Alt 2. Slots for a resource pool is (pre-)configured, wherein the slots are applied with periodicity.
  FFS: signaling details
  FFS: how to apply the above bitmap signaling, For example, to all slots or only to a set of slots
  FFS: symbols for sidelink in the slot, how to indicate for the case when not all symbols are for SL Agreements:

For Rel-16, (normal CP)
Support 7, 8, 9, ..., 14 symbols in a slot without SL-SSB for SL operation
  Target reusing Uu DM-RS patterns for each of the symbol-length, with modifications as necessary No other additional spec impact is expected for supporting 7, 8, . . . , 13 # of DM-RS symbols
2, 3, 4

For a dedicated carrier, only 14-symbol is mandatory

There is a single (pre-)configured length of SL symbols in a slot without SL-SSB per SL BWP.

There is a single (pre-)configured starting symbol for SL in a slot without SL-SSB per SL BWP.

Agreements:

NR supports SL transmissions at least in cell-specific UL resources in Uu.

Figures 11A, 11B:
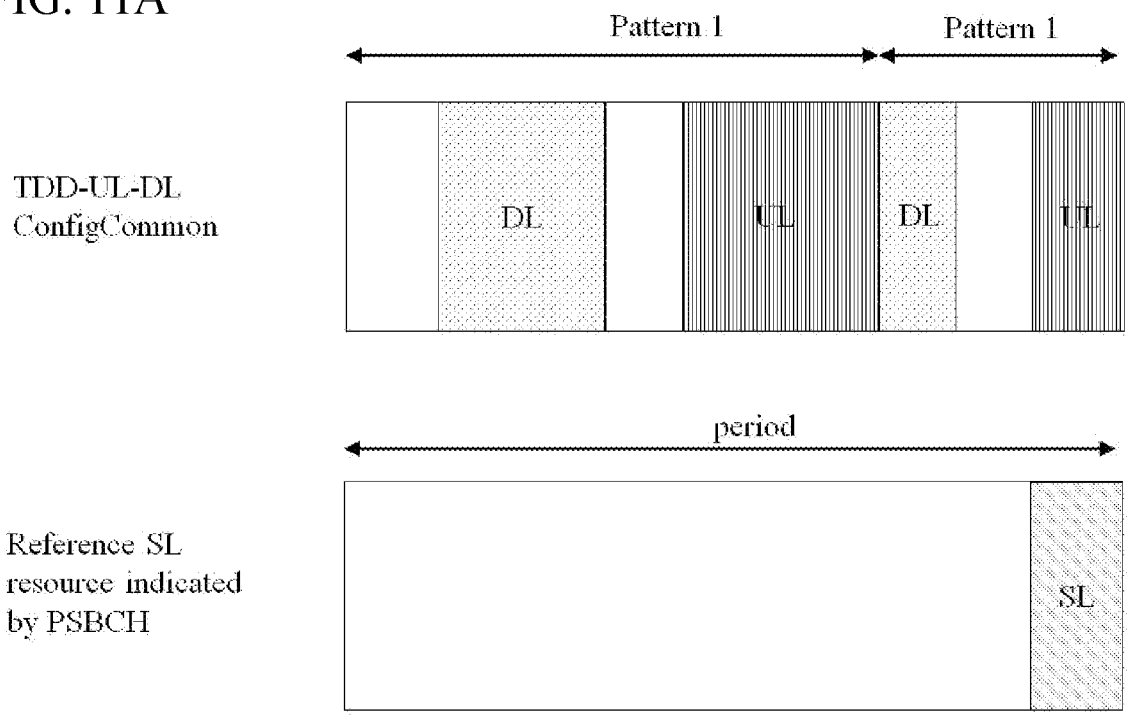

When a UE is in-coverage, cell-specific UL resources will be indicated by higher layer parameter TDD-UL-DL-ConfigComnzon. For out-of-coverage UE, PSBCH transmitted by another UE will indicate information about reference sidelink resources which can be potentially used for NR sidelink transmission. Due to the signaling overhead of PSBCH, a single pattern indicating the number of UL slots will be included in PSBCH contents while TDD-UL-DL-ConfigCommon could have two patterns indicating the number of UL slots and the number of UL symbols. In other words, UL resources indicated by PSBCH could be different from TDD-UL-DL-ConfigCommon as shown in FIG. 11A. When the TX UE and RX UE have the different understanding on the cell-specific UL resources or reference SL resources, resource reservation or PSFCH transmission timing would not work properly. In this case, even for the in-coverage UE, it would be necessary that higher layer indicate reference SL resources whose value is the same as reference SL resources indicated by the PBSCH.

Next, Depending on the TDD-UL-DL-ConfigCommon, all the symbols in a slot could be cell-specific UL resources, or a subset of symbols in a slow could be cell-specific UL resources. Meanwhile, a UE can be provided a number of symbols in a slot, by lengthSLsymbols, starting from symbol with index of statSLsymbols for NR sidelink. In this case, for all the slots indicated by the reference SL resource configuration, lengthSLsymbols symbols from startSLsymbols of a slot are cell-specific UL resources.

Proposal 4: A UE is configured with reference SL resources via higher layer signaling.

Reference SL resource configuration consists of following parameters:

P: Periodicity of SL reference slot pattern

N_refSL: Number of consecutive SL reference slots with a period UE assumes that the last N_refSL slots with the period are reference SL resource.

Considering resource usage flexibility, it can be considered to use bitmap is applied to the reference SL resources to indicate SL resource pool in time domain. To reduce signaling overhead, the bitmap with a small size compared to the total number of slots for the reference SL resources could be applied periodically. Next, it needs to consider that it will not be supported to multiplex S-SSB with other SL channels in a slot since S-SSB will occupy all the symbols in a slot. In addition, since the symbol duration of S-SSB could be different from other SL channels, FDM between S-SSB and other SL channels can cause additional AGC period or TX power change in a slot. In those points of views, slots available for S-SSB would not be included in the SL resource pool in time domain. In our view, as in LTE V2X, slots for S-SSB can be excluded from the reference SL resources before applying bitmap with a certain period. However, in this case, it is necessary to determine how to handle the case where the total number of slots of the reference SL resources excluding S-SSB slots within a system frame is not multiples of the bitmap size. If the LTE principle is reused, the concept of reserved slot can be used to resolve this issue. To be specific, among slots of the reference SL resources excluding S-SSB slots, there can be a number of slots that the bitmap cannot be applied and these slots are evenly distributed over the reference SL resources excluding S-SSB slots. The bitmap will be applied to the remaining slots of the reference SL resources to indicate SL resource pool in time domain.

Proposal 5: The set of slots for SL resource pool in time domain is given by following steps:

Step 1: The set of slots is given by reference SL resource configuration.

Step 2: Slots configured for S-SSB are excluded from the set in Step 1.

Step 3: Reserved slots to be excluded form the remaining set in Step 2 is determined by the following steps:

Step 3-1: Slots in the set in Step 2 are denoted by ($l_0$, $l_1$, . . . , $l_{N_{refSL}-N_S-SSB-1}$) arranged in increasing order of slot index where $N_{refSL}$ is the number of slots indicated by the reference SL resources within a radio frame and $N_{S-SSB}B$ is the number of slots in which S-SSB is configured within a radio frame.

Step 3-2: a slot $l_r$ belongs to the reserved slot if $$r = \left\lfloor \frac{m(N_{refSL} - N_{S-SSB})}{N_{reserved}} \right\rfloor$$

where m=0, 1, . . . $N_{reserved}-1$ and $N_{reserved}=(N_{refSL}-N_{S-SSB}) \mod L_{bitmap}$. $L_{bitmap}$ is the length of the bitmap is configured by higher layers.

Step 4: The UE determines the set of slots assigned to a SL resource pool as follows:

A bitmap ($b_0$, $b_1$, . . . , $b_{L_{bitmap}}$) associated with the resource pool is used.

A slog $t_k^{SL}$ in the remaining set in Step 3 belongs to the SL resource pool if $b_k=1$ wherein k'=k mod $L_{bitmap}$.

Alternatively, the bitmap can be applied to slots indicated by the reference SL resources, and then S-SSB slots is excluded from the set of slots indicated by the bitmap to determine the set of slots for the SL resource pool.

Regarding the SL resource pool configuration for frequency domain resource, it is necessary to clarify how to interpret higher layer parameter startRB-Subchannel. To be specific, the reference point of the starting RB index for SL resource pool in frequency domain need to be defined explicitly. Considering that the SL resource pool shall be confined within a configured SL BWP, it seems straightforward that the starting RB index is with respect to the lowest RB of the SL BWP.

Proposal 6: Higher Layer parameter startRB-Subchannel is defined as the lowest RB index of the sub-channel with the lowest index in the resource pool with respect to the lowest RB index of the SL BWP.

According to TS38.101, there is case where the number of PRBs with a channel bandwidth is 11, 18, or 24. For instance, for SCS of 30 kHz, when the channel bandwidth is 5 MHz, the number of PRB will be 11. In those cases, at this moment, considering the minimum sub-channel size is 10 PRB, there is only one sub-channels within a resource pool and remaining PRBs would be wasted. Alternatively, it can be considered that some portion of sub-channels in a resource pool could have larger size than the configured sub-channel size to utilize resource efficiently without orphan resources. For instance, for channel bandwidth of 24

PRB, the first sub-channel size could be 14 while remaining sub-channel has the size of 10 PRB.

Proposal 7: Support the case where the number of PRBs for a resource pool is not multiple of configured sub-channel size.

The size of the lowest sub-channel in a resource pool is determined by (total number of PRBs for a resource pool −configured sub-channel size*(number of sub-channels in a resource pool −1)).

The size of remaining sub-channels is the configured sub-channel size.

1.1.3. TBS Determination

In NR Uu link, since the symbol duration of PDSCH/PUSCH can be dynamically changed, it is supported that formula-based TB size determination. In this case, one of the design principles is ensuring to enable the same TBS between initial transmission and retransmission with the same-different number of PRBs or the same/different number of symbols in some cases. In this case UE can derive TBS even though the UE successfully decode only DCI scheduling retransmission. Regarding the formula for TBS determination, the intermediate information bit size is derived by the coding rate and modulation order given by MCS, the number of layer, the reference number of REs per RB for data mapping, and the number of PRBs. When the number of REs per RB is counted, the symbol duration of PDSCH or PUSCH, and DMRS overhead are considered. In addition, remaining overhead is treated by a single RRC configured parameter. In other words, even though PDSCH resource can be partially overlapped with other channels such as PDCCH, SSB, CSI-RS, or PT-RS, these overheads are not directly considered since these channels would not always overlapped with PDSCH. Similarly, resources for UCI mapping on PUSCH does not considered for TBS determination for PUSCH.

On the other hand, considering PSCCH/PSSCH multiplexing Option 3, PSSCH resource will be always overlapped with PSCCH resources. In addition, PSSCH resource may include AGC symbol and TX-RX switching symbol. In this case, if these overheads are not considered for TBS determination for NR sidelink, the derived TBS would be overestimated. Alternatively, it can be considered that TX UE intentionally decrease MCS value. However, in this case, higher MCS would not be used frequently.

Moreover, the symbol duration of PSSCH can be changed, but it will not be controlled by SCI. To be specific, depending on PSFCH resource period, some slots will contains PSFCH resources, and other slots will not contains PSFCH resources. In a licensed carrier, when UL and SL can be TDMed in a slot, the symbol duration of PSSCH can be changed depending on the number of symbols available for NR sidelink in a slot. Since initial transmission and retransmission could have different symbol duration of PSSCH, it would be necessary to define reference number of RE which is independent on the actual symbol duration of PSSCH to ensure to enable the same TBS between initial transmission and retransmission. For instance, the symbol duration of PSSCH transmission in a non-PSFCH slot could be used for TBS determination. In a similar manner, since the PSSCH DMRS pattern would be dynamically changed according to the SCI indication, it would be necessary to define reference overhead for the PSSCH DMRS. For instance, the number of REs for PSSCH DMRS per PRB would be determined based on the lowest DMRS density among the (pre)configured DMRS pattern. It would be beneficial to express peak data rate.

Next, the actual $2^{nd}$-stage SCI overhead is derived by the sum of code block size which is given by TB size. In other words, if the $2^{nd}$-stage SCI overhead is used to derive TBS, it causes chicken-egg problem. In other words, for TBS determination, the $2^{nd}$-stage SCI overhead will not be considered.

The upper bound of the number of REs per PRB could be determined by excluding TX-RX switching period, 2 symbol-PSSCH DMRS overhead, and AGC symbol overhead. In this case, the upper bound of the reference number of REs for TBS determination would be 132.

Observation 1: In NR sidelink resource, AGC symbol and TX-RX switching symbol needs to be excluded for TBS determination.

Proposal 9: For TBS determination, following procedure is performed

The UE shall first determine the number of REs within the slot

A UE first determines the number of REs allocated for PSSCH within a PRB by N'_RE=N_SC*N_symb —N_DMRS, N_SC=12 is the number of subcarriers in a PRB.

N_symb is the number of symbols of the PSSCH resource allocation within the slot assuming that PSFCH is not configured in this slot AGC symbol and TX-RX switching period are not included in the PSSCH resource allocation within the slot N_DMRS is the number of REs for DM-RS per PRB in the PSSCH resource allocation assuming that PSFCH is not configured in this slot, which is corresponding to the lowest DMRS density among the (pre)configured DM-RS candidate pattern(s)

N_RE=N'_RE*n_PRB N_PSCCH,

N_PSCCH is the number of REs for the corresponding PSCCH.

Intermediate number of information bits (N_info) is obtaining by N_info-N_RE*R*Q_m*v.

R is the coding rate given by MCS field.

Q_m is the modulation order by MCS field v is the number of layers.

1.1.4. SCI Design

The size variation of 2nd-stage can have impact on UE complexity. To be specific, when the size of 2nd-stage is varying in slot-by-slot, UE needs to be ready to have multiple Polar decoder with different sizes. In NR Uu link, considered UE complexity, the number of DCI format size for a UE is limited in semi-static manner. The total number of different DCI format size is currently 4, and the total number of different DCI format scrambled with C-RNTI is 3. This kind of restriction is called DCI format size budget. In a similar manner, when the possible sizes of 2nd-stage is too large, it may not be feasible for UE implementation. Instead, it would be needed to perform size fitting for 2nd-stage considering UE complexity. In other words, a number of different 2nd-stage candidates could have the same payload size with different contents.

Observation 2: It can be considered to restrict the number of the size of 2nd-stage considering UE complexity.

SCI fields for broadcast, unicast, and groupcast without the TX-RX distance based HARQ-ACK feedback operation would be the same except for the one or two SCI fields, therefore, it can be considered that a single 2nd-stage SCI format can be used to schedule broadcast, unicast, or groupcast without the TX-RX distance based HARQ-ACK feedback operation. In this case, another 2nd-stage SCI format conveying Zone ID field and Communication range requirement field will be used to schedule groupcast with HARQ feedback Option 1 with the TX-RX distance-based HARQ-ACK feedback operation.

Regarding HARQ feedback Option indicator field, in our view, groupcast with HARQ feedback Option 1 could be used without TX-RX distance-based HARQ-ACK feedback operation. To be specific, a resource pool would not have sufficiently large number of PSFCH resources to support groupcast with HARQ feedback Option 2 to have acceptable PSFCH collision probability. Meanwhile, a UE can be provided by application such as platooning. Another example is that a PSCCH/PSSCH TX UE may not decide its own location for TX-RX distance-based HARQ-ACK feedback operation. In those cases, it is necessary to support that groupcast with HARQ feedback Option 1 is scheduled by a SCI format without Zone ID field and Communication range requirement field. In addition, in RAN1 #98bis, it is agreed that "SCI explicitly indicates whether HARQ feedback is used or not for the corresponding PSSCH transmission" as working assumption. In this case, the SCI format also needs to indicate how the PSCCH/PSSCH RX UE transmit SL HARQ feedback of the PSSCH transmission. In our view, it can be considered to support joint indication of whether or how the RX UE transmit SL HARQ feedback for SCI overhead saving.

Proposal 11: Support joint indication of SL HARQ feedback enabling/disabling and groupcast HARQ feedback Option in the $2^{nd}$-stage SCI.

Proposal 12: Support following $2^{nd}$-stage SCI formats in Rel-16 NR sidelink:

SCI format 0_2: (this format is used for all the cast type and groupcast HARQ_feedback Options)
  HARQ Process ID
  New data indicator
  Redundancy version
  Source ID
  Destination ID
  HARQ feedback indicator
    00: No HARQ feedback request
    01: HARQ feedback for groupcast Option 2 (ACK/NACK feedback)
    10: HARQ feedback for groupcast Option 1 (NACK-only feedback)
    11: reserved
  CSI request
SCI format 0_3: (this format is used for groupcast with HARQ feedback Option 1 only)
  HARQ Process ID
  New data indicator
  Redundancy version
  Source ID
  Destination ID
  Zone ID
  Communication range requirement In this case, PSSCH for broadcast will be scheduled by the SCI format 0_2 with HARQ feedback indicator=00 and CSI request=0. For groupcast with HARQ feedback Option 1, PSSCH will be scheduled by the SCI format 0_2 with HARQ feedback indicator=00 or 10 and CSI request=or the SCI format 0_3.

UE procedure for transmitting Sidelink Control Information needs to be described in the specification as in LTE V2X. For instance, UE shall set the MCS as indicated by higher layers. A TB can consists of multiple logical channel with different priority. In this case the L1-priority field in SIC will be set based on the highest priority among those priorities. All the logical channels associated with the same TB will have the same cast type, destination ID, and source ID. In this case, UE behavior according to the cast type, L1-destination ID, and L1-source ID, would be set as indicated by higher layers corresponding to the transport block. On the TX-RX distance-based HARQ feedback operation, TX UE's location will be transformed into Zone ID in higher layers, and higher layer will give the higher MCR to physical layer for a TB as agreed in RAN2 #108.

In addition, as in agreement made in email discussion [3], UE shall randomly select one of frequency-domain OCC for PSCCH DMRS.

Proposal 14: Capture "the UE shall randomly select the OCC index n_OCC in each PSCCH transmission" in TS 38.213 according to the following agreement.

Agreements:
  NR PDCCH DMRS sequence is the baseline for PSCCH DMRS sequence at least with the following modification.
    n_ID is determined by a (pre-)configured value per resource pool
    Frequency-domain OCC is applied, one of the [2 or 3 or 4] OCCs is randomly selected by the Tx UE.
  Note: there is no (pre-)configuration on the number of OCCs.

PSCCH Design

V2X, OCC length with length 4 is used for the PSCCH DMRS. However, since candidate number of PRBs for PSCCH is {10, 12, 15, 20, 25}, the OCC can be applied across different PRBs, if the numbers of PRBs for PSCCH is 10 or 15 or 25. For example, when numbers of PRBs for PSCCH is 10, The orthogonal cover code is applied to every four REs for PSSCH DMRS in a symbol from the lowest subcarrier index. OCC length with length 4 cannot be used for the PSCCH DMRS in a symbol from the lowest subcarrier index. OCC length with length 4 cannot be used for the PSCCH DMRS. Thus, the candidate number of {10, 15, 25} for the number of PRBs for PSCCH is replace with {8, 16, 24}.

Proposal 16: Support frequency-domain OCC with length 4 for PSCCH DMRS sequence.

Orthogonal cover code with length 4 is defined in FIG. 11B.
The orthogonal cover code is applied to every four REs for PSCCH DMRS in a symbol from the lowest subcarrier index.
Candidate number of {10, 15, 25} for the number of PRBs for PSCCH is replaced with {8, 16, 24}.

Regarding PSCCH DMRS sequence generation, according to agreement made in email discussion [3], n_ID is determined by a (pre-)configured value per resource.

Proposal 17: Capture "n_ID is determined by a (pre-)configured value per resource pool." in TS 38.211 for random seed of PSCCH DMRS sequence generation according to the following agreement.

Agreements:
  NR PDCCH DMRS sequence is the baseline for PSCCH DMRS sequence at least with the following modification.
    n_ID is determined by a (pre-)configured value per resource pool
    Frequency-domain OCC is applied, one of the [2 or 3 or 4] OCCs is randomly selected by the Tx UE.
  Note: there is no (pre-)configuration on the number of OCCs.

In a similar manner, PSCCH scrambling sequence can be designed considering the sequence randomization between NR Uu link and NR sidelink, and all the UEs can decide SCI conveyed on PSCCH at least for sensing operation. In addition, it can be considered that n_RNTI is replace with PSCCH DMRS OCC index for the scrambling sequence for PSCCH.

Proposal 18: PSCCH scrambling sequence generation is initialized with $C_{init} = n_{RNTI} 2^{16} + n_{ID}$ $n_{ID} \in \{0, 1, \ldots, 65535\}$ is (pre)configured per resource pool.

$n_{RNTI} = 0$

Regarding precoding for PSSCH, according to agreement made in email discussion [4], for Rel-16 NR sidelink, only wideband precoding is assumed for PSSCH transmission and it is noted that this implies that PRG size equal to scheduled PSSCH BW is assumed in Rel-16, In a similar manner, only wideband precoding is assumed for PSCCH to take advantage of PSCCH coverage.

Proposal 20: Precoder granularity of PSCCH is the same as the number of PRBs for the PSCCH.

According to the UE procedure related to PSSCH, there are two aspects: one is the UE procedure for transmitting PSSCH, and the other is the UE procedure for receiving PSSCH. On the other hand, in the latest version of the NR specification, it seems that the UE procedure for receiving PSCCH is missing.

1.1.5. PSSCH and PSSCH DMRS Design

In NR structure, two DMRS types are supported for PDSCH/PUSCH DMRS. DMRS type 1 targets to cover up roughly 1000 ns delay spread (which cause frequency selectivity). Meanwhile, DMRS type 2 targets to support MU-MIMO and more antenna ports (12 APs). However, in NR V2X structure, the number of antenna ports will be limited (e.g. up to 2), and MU-MIMO is not a main target. Thus, for a carrier with a given numerology, there is no clear motivation/benefit to support multiple DM-RS patterns in frequency domain for PSSCH. Meanwhile, considering that PSCCH resource will be confined within PSSCH resource, for PSSCH DMRS pattern in time-domain design, it is necessary to make a decision on the form of PSCCH especially on symbol duration in advance.

Proposal 23: For NR PSSCH DMRS pattern in frequency domain, support both DMRS type 1 and DMRS type 2, and one of them is (pre)configured per resource pool.

In Rel-16 NR sidelink, 7, 8, 9, . . . , 14 symbols in a slot without SL_SSB for SL operation is supported with normal CP and only 14-symbol is mandatory for a dedicated carrier. In addition, the position(s) of the PSSCH DMRS symbols is given by the duration of the scheduled resources for transmission of PSSCH (i.e., 1_d=6, 7, 8, 9, . . . , 13 symbols (including AGC symbol)) and the associated PSCCH (i.e., 2 or 3 symbols).

In a similar manner, in case of ECP, a clarification is required for PSSCH DMRS pattern in time domain, supported SL symbol duration in a slot, and the supported duration of the PSCCH. Since PSCCH symbol duration is related to the PSCCH coverage, PSCCH symbol duration does not need to vary with ECP or is limited to 2 symbols. In addition, 6, 7, 8, . . . , 12 symbols in a slot without SL-SSB for SL operation is supported with ECP and only 12-symbol is mandatory for a dedicated carrier. Thus, in Rel-16 NR sidelink with ECP, no additional PSSCH DMRS pattern is introduced, and less than 12 of 1_d is used for PSSCH DMRS pattern. In addition, for value of 1_d shorter than 6, 2-DMRS symbols pattern is not supported in NR Uulink. In a similar manner, in case of ECP, for value of 1_d shorter than 6, 2-DRMS symbols pattern is not supported in NR sidelink.

Proposal 24: In Rel-16 NR sidelink with ECP,

Support 6, 7, 8, 9, . . . , 12 symbols in a slot without SL-SSB for SL operation For a dedicated carrier, inly 12-symbol is mandatory No additional PSSCH DMRS pattern is introduced According to the agreement, DMRS pattern could be dynamically indicated by SCI. The motivation of the dynamic DMRS pattern is mainly to change DMRS density of PSSCH. In this point of view, it can be considered that dmrs-AdditionalPosition or the target DMRS density is indicated by SCI. Considering signaling overhead, candidates of dmrs-AdditionalPosition to be indicated by SCI can be (pre)configured. In this case, the exact DMRS pattern will be given by dmrs-AdditionalPositionand and symbol duration of PSSCH. On the other hand, since the symbol duration of the PSSCH is different in the PSFCH slot and the non-PSFCH slot, the DMRS pattern is also different for the PSFCH slot and non-PSFCH slot. Therefore, a parameter indicating a distinction between the PSFCH slot and the non-PSFCH slot is required, and it can be indicated in different DMRS pattern candidates between PSFCH slot and non-PSFCH slot. For example, the number of DMRS symbols in the PSFCH slot is indicated as 3 or 4, and the number of DMRS symbols in the non-PSFCH slot is indicated as 2 or 3. In this case, different DMRS patterns are indicated for the PSFCH slot and the non-PSFCH slot. PSFCH slot.

Proposal 25: For NR PSSCH DMRS pattern in time domain, candidates of the number of PSSCH DM-RS are (pre)configured for PSFCH slot and non-PSFCH slot separately, and a SCI indicates one of the (pre)configured candidates.

For scrambling sequence design for PSSCH, PUSCH scrambling sequence can be a baseline with consideration of how to handle the case where multiple PSSCH transmissions are fully or partially overlapped in time-and-frequency resources. Furthermore, according to the agreement, scrambling operation for the $2^{nd}$-stage SCI is applied separately with SL-SCH. The scrambling sequence for the $2^{nd}$-stage SCI needs to be independent on the parameters given by the $2^{nd}$-stage SCI while the scrambling sequence for SL-SCH could use the parameters given by the $2^{nd}$-stage SCI. For instance, L1-source ID and/or L1-destination ID. In such case, the scrambling sequence for SL-SCH may need to use PSCCH CRC again. In case of PSFCH or PSCCH DMRS sequence generation, multiple seed values for initialization are not needed for considering UE complexity. In a similar manner, for $2^{nd}$-stage SCI and SL-SCH scrambling sequence generation, supporting multiple seed values for initialization in the same channel may increase UE complexity.

Proposal 26: $2^{nd}$-stage SCI and SL-SCH scrambling sequence generation is initialized with $C_{init} = n_{RNTI} 2^{15} + n_{ID}$ $n_{ID} \in \{0, 1, \ldots, 1023\}$ is (pre)configured per resource pool.

$n_{RNTI}$ is derived by 16-bit LSB of PSCCH CRC for the $2^{nd}$-stage SCI and SL-SCH.

Regarding MCS table used for PSSCH transmission, at this moment, at least one MCS table is (pre)-configured, and 256QAM MCS table and low-spectral efficiency 64QAM MCS table would be optional. Meanwhile, pairs of modulation order and coding rate for MCS index 0~19 in 256QAM MCS table are already supported by normal 64QAM MCS table with different MCS index. Similarly, pairs of modulation order and coding rate for MCS index 6~28 in low-spectral efficiency 64QAM MCS table are already supported by normal 64QAM MCS table with different MCS index. In the perspective of UE complexity, even though 256QAM MCS table or low-spectral efficiency 64QAM MCS table is (pre)configured before exchange relevant UE capability, TX UE can transmit PSSCH, and the RX UE can demodulate and decode PSSCH by using the (pre)configured MCS table when the MCS index is selected among the entries supported in normal 64QAM MCS table. In this case, only drawback would low flexibility on the MCS selection. Alternatively, it can be considered that the MCS table can be overwritten by PC5 RRC. However, in this case, during the PC5 RRC (re)configuration period, TX UE and RX UE may have different understanding on the MCS table selection, and it will cause PSSCH detection performance degradation. To avoid this ambiguity issue, it can be considered that SCI indicates MCS table actually used for PSSCH transmission.

Proposal 28: If more than on MCS tables configuration introduced, SCI indicates MCS table actually used for PSSCH transmission.

1.1.6. PSFCH Format for SFCI

In RAN1 #99 meeting [2], it is agreed that, "The number of cyclic shift pairs used for a PSFCH transmission (denoted by Y) that can be multiplexed in a PRB is (pre-)configured per resource pool among {1, 2, 3, 4, 6}". Remaining issues is the exact values of cyclic shifts use for a PSFCH transmission. In our view, for a given number of cyclic shift pairs for a PSFCH transmission, it would be beneficial to maximize the distance between different cyclic shifts considering target delay spread value.

Proposal 29: Support cyclic shift values for a given number of cyclic shift pairs used for a PSFCH transmission that can be multiplexed in a PRB When the number of m_O values is 1,
{0, 6}
When the number of m_O values is 2,
{0, 6}, {3, 9}
When the number of m_0 values is 3,
{0, 6}, {2, 8}, {4, 10}
When the number of m_0 values is 4,
{0, 6}, {2, 8}, {4, 10}, {5, 11}
When the number of m_0 values is 6,
{0, 6}, {1, 7}, {2, 8}, {3, 9}, {4, 10}, {5, 11}

1.1.7. Sidelink CSI-RS Design

It is necessary to ensure that the sidelink CSI-RS is not overlapped with REs used for PSSCH DMRS. In a shared carrier, the symbol duration of PSSCH could be changed slot-by-slot, then the PSSCH DMRS pattern in time domain would be also changed. For some cases, it would be possible that the last symbol index of PSSCH is used for PSSCH DMRS. As described in 2.1.6, the symbol duration of PSSCH would be different for the PSFCH slot and non-PSFCH slot. On the other hand, the sidelink CSI-RS is not FDMed/CDMed with PSSCH DMRS. In those points of views, sidelink CSI-RS symbol position is a slot is configured by PC5-RRC signaling for PSFCH slot and for non-PSFCH slot separately.

Proposal 30: Sidelink CSI-RS symbol position in a slot is configured by PC5-RRC signaling for PSFCH slot and for non-PSFCH slot separately.

1.1.8. Sidelink PT-RS Design

Figure 12A:
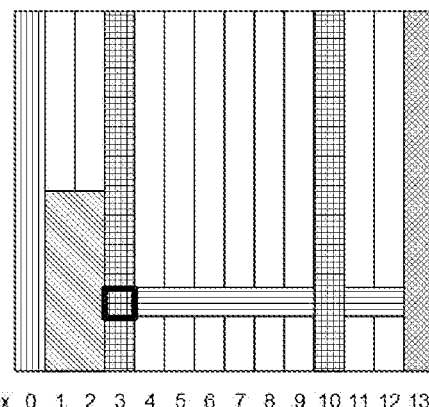
Figure 12B:
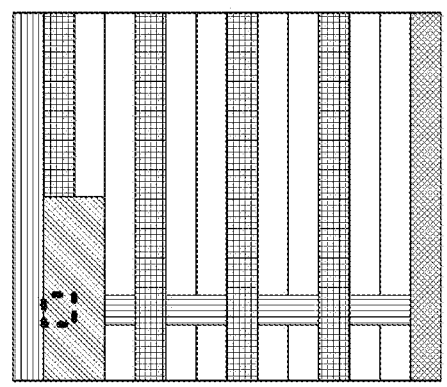
Figure 12C:
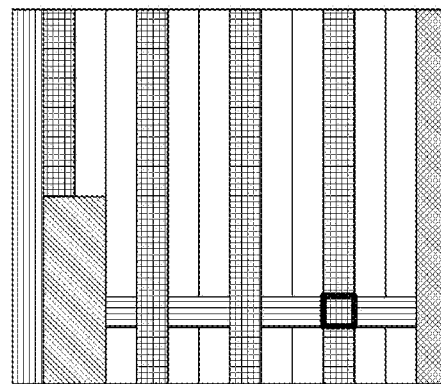

Regarding physical sequence generation for sidelink PT-RS, in NR Uu link, the sequence of the PUSCH DMRS is copied according to PT-RS RE offset. In a similar, if the PSSCH DMRS is not FDMed with SCI (and sidelink PT-RS is overlapped with $1^{st}$ SCI in time domain or not), the sequence of the first DMRS position at that subcarrier is used to generate the PT-RS sequence as shown in FIG. 12A. However, if the PSSCH DMRS is FDMed with $1^{st}$ SCI and sidelink PT-RS is overlapped with $1^{st}$ SCI in time domain as shown in FIG. 12B, the sequence of the first DMRS position at the subcarrier is unavailable. In this case, since the last DMRS position of the PSSCH DMRS symbols (given by the duration of the scheduled resources for transmission of PSSCH and the associated PSCCH) at the subcarrier is not always FDMed with $1^{st}$ SCI as shown in FIG. 12C, PT-RS sequence mapped on subcarrier k is the same as PSSCH DMRS sequence mapped on subcarrier k in the last PSSCH DMRS symbol position within a PSSCH symbol duration Proposal 31: For sidelink PT-RS, PT-RS sequence mapped on subcarrier k is the same as PSSCH DMRS sequence mapped on subcarrier k in the last PSSCH DMRS symbol position within a PSSCH symbol duration.

Examples of Communication Systems Applicable to the Present Disclosure

The various descriptions, functions, procedures, proposals, methods, and/or operational flowcharts of the present disclosure described in this document may be applied to, without being limited to, a variety of fields requiring wireless communication/connection (e.g., 5G) between devices.

Hereinafter, a description will be given in more detail with reference to the drawings. In the following drawings/description, the same reference symbols may denote the same or corresponding hardware blocks, software blocks, or functional blocks unless described otherwise.

Figure 13:
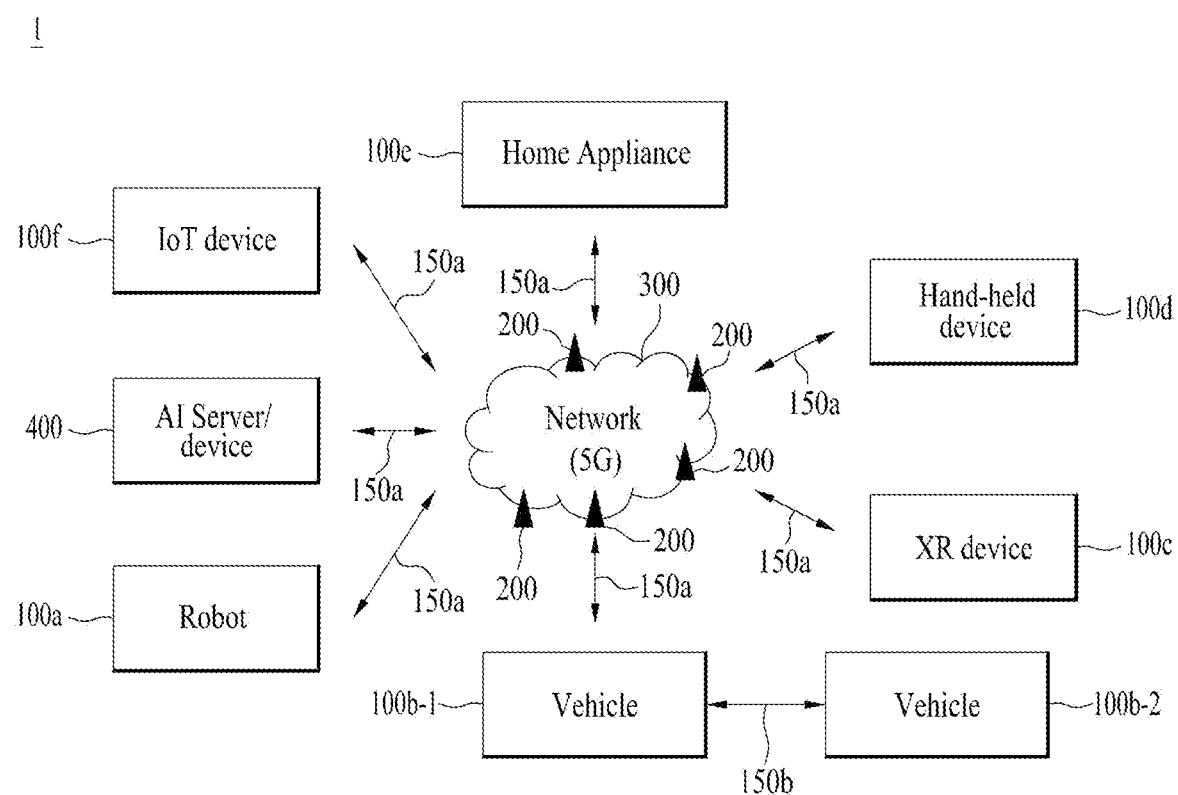
FIGS. 13 to 19 are diagrams for explaining various devices to which embodiment(s) are applicable.

FIG. 13 illustrates a communication system 1 applied to the present disclosure.

Referring to FIG. 13, a communication system 1 applied to the present disclosure includes wireless devices, BSs, and a network. Herein, the wireless devices represent devices performing communication using RAT (e.g., 5G NR or LTE) and may be referred to as communication/radio/5G devices. The wireless devices may include, without being limited to, a robot 100a, vehicles 100b-1 and 100b-2, an extended reality (XR) device 100c, a hand-held device 100d, a home appliance 100e, an Internet of things (IoT) device 100f, and an artificial intelligence (AI) device/server 400. For example, the vehicles may include a vehicle having a wireless communication function, an autonomous driving vehicle, and a vehicle capable of performing communication between vehicles. Herein, the vehicles may include an unmanned aerial vehicle (UAV) (e.g., a drone). The XR device may include an augmented reality (AR)/virtual reality (VR)/mixed reality (MR) device and may be implemented in the form of a head-mounted device (HMD), a head-up display (HUD) mounted in a vehicle, a television, a smartphone, a computer, a wearable device, a home appliance device, a digital signage, a vehicle, a robot, etc. The hand-held device may include a smartphone, a smartpad, a wearable device (e.g., a smartwatch or a smart-glasses), and a computer (e.g., a notebook). The home appliance may include a TV, a refrigerator, and a washing machine. The IoT device may include a sensor and a smartmeter. For example, the BSs and the network may be implemented as wireless devices and a specific wireless device 200a may operate as a BS/network node with respect to other wireless devices.

The wireless devices 100a to 100f may be connected to the network 300 via the BSs 200. An AI technology may be applied to the wireless devices 100a to 100f and the wireless devices 100a to 100f may be connected to the AI server 400 via the network 300. The network 300 may be configured using a 3G network, a 4G (e.g., LTE) network, or a 5G (e.g., NR) network. Although the wireless devices 100a to 100f may communicate with each other through the BSs 200/network 300, the wireless devices 100a to 100f may perform direct communication (e.g., sidelink communication) with each other without passing through the BSs/network. For example, the vehicles 100b-1 and 100b-2 may perform direct communication (e.g. V2V/V2X communication). The IoT device (e.g., a sensor) may perform direct communication with other IoT devices (e.g., sensors) or other wireless devices 100a to 100f.

Wireless communication/connections 150a, 150b, or 150c may be established between the wireless devices 100a to 100f/BS 200, or BS 200/BS 200. Herein, the wireless communication/connections may be established through various RATs (e.g., 5G NR) such as UL/DL communication 150a, sidelink communication 150b (or, D2D communication), or inter BS communication (e.g. relay, integrated access backhaul (IAB)). The wireless devices and the BSs/the wireless devices may transmit/receive radio signals to/from each other through the wireless communication/connections 150a and 150b. For example, the wireless communication/connections 150a and 150b may transmit/receive signals through various physical channels. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure.

Examples of wireless devices applicable to the present disclosure

Figure 14:
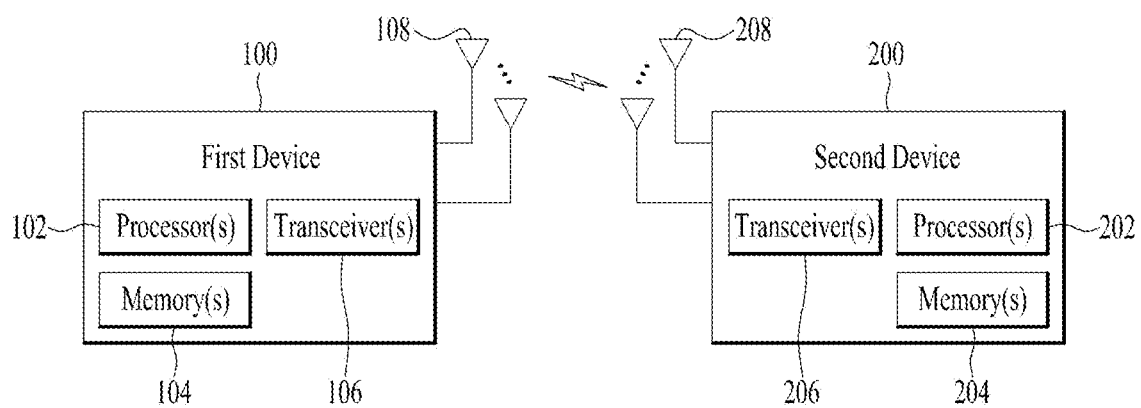

FIG. 14 illustrates wireless devices applicable to the present disclosure.

Referring to FIG. 14, a first wireless device 100 and a second wireless device 200 may transmit radio signals through a variety of RATs (e.g., LTE and NR). Herein, {the first wireless device 100 and the second wireless device 200} may correspond to {the wireless device 100x and the BS 200} and/or {the wireless device 100x and the wireless device 100x} of FIG. 13.

The first wireless device 100 may include one or more processors 102 and one or more memories 104 and additionally further include one or more transceivers 106 and/or one or more antennas 108. The processor(s) 102 may control the memory(s) 104 and/or the transceiver(s) 106 and may be configured to implement the descriptions, functions, procedures, proposals, methods, and/or operational flowcharts disclosed in this document. For example, the processor(s) 102 may process information within the memory(s) 104 to generate first information/signals and then transmit radio signals including the first information/signals through the transceiver(s) 106. The processor(s) 102 may receive radio signals including second information/signals through the transceiver 106 and then store information obtained by processing the second information/signals in the memory(s) 104. The memory(s) 104 may be connected to the processor(s) 102 and may store a variety of information related to operations of the processor(s) 102. For example, the memory(s) 104 may store software code including commands for performing a part or the entirety of processes controlled by the processor(s) 102 or for performing the descriptions, functions, procedures, proposals, methods, and/or operational flowcharts disclosed in this document. Herein, the processor(s) 102 and the memory(s) 104 may be a part of a communication modem/circuit/chip designed to implement RAT (e.g., LTE or NR). The transceiver(s) 106 may be connected to the processor(s) 102 and transmit and/or receive radio signals through one or more antennas 108. Each of the transceiver(s) 106 may include a transmitter and/or a receiver. The transceiver(s) 106 may be interchangeably used with Radio Frequency (RF) unit(s). In the present disclosure, the wireless device may represent a communication modem/circuit/chip.

The second wireless device 200 may include one or more processors 202 and one or more memories 204 and additionally further include one or more transceivers 206 and/or one or more antennas 208. The processor(s) 202 may control the memory(s) 204 and/or the transceiver(s) 206 and may be configured to implement the descriptions, functions, procedures, proposals, methods, and/or operational flowcharts disclosed in this document. For example, the processor(s) 202 may process information within the memory(s) 204 to generate third information/signals and then transmit radio signals including the third information/signals through the transceiver(s) 206. The processor(s) 202 may receive radio signals including fourth information/signals through the transceiver(s) 106 and then store information obtained by processing the fourth information/signals in the memory(s) 204. The memory(s) 204 may be connected to the processor(s) 202 and may store a variety of information related to operations of the processor(s) 202. For example, the memory(s) 204 may store software code including commands for performing a part or the entirety of processes controlled by the processor(s) 202 or for performing the descriptions, functions, procedures, proposals, methods, and/or operational flowcharts disclosed in this document. Herein, the processor(s) 202 and the memory(s) 204 may be a part of a communication modem/circuit/chip designed to implement RAT (e.g., LTE or NR). The transceiver(s) 206 may be connected to the processor(s) 202 and transmit and/or receive radio signals through one or more antennas 208. Each of the transceiver(s) 206 may include a transmitter and/or a receiver. The transceiver(s) 206 may be interchangeably used with RF unit(s). In the present disclosure, the wireless device may represent a communication modem/circuit/chip.

Hereinafter, hardware elements of the wireless devices 100 and 200 will be described more specifically. One or more protocol layers may be implemented by, without being limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more Protocol Data Units (PDUs) and/or one or more service data unit (SDUs) according to the descriptions, functions, procedures, proposals, methods, and/or operational flowcharts disclosed in this document. The one or more processors 102 and 202 may generate messages, control information, data, or information according to the descriptions, functions, procedures, proposals, methods, and/or operational flowcharts disclosed in this document. The one or more processors 102 and 202 may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the descriptions, functions, procedures, proposals, methods, and/or operational flowcharts disclosed in this document.

The one or more processors 102 and 202 may be referred to as controllers, microcontrollers, microprocessors, or microcomputers. The one or more processors 102 and 202 may be implemented by hardware, firmware, software, or a combination thereof. As an example, one or more application specific integrated circuits (ASICs), one or more digital signal processors (DSPs), one or more digital signal processing devices (DSPDs), one or more programmable logic devices (PLDs), or one or more field programmable gate arrays (FPGAs) may be included in the one or more processors 102 and 202. The descriptions, functions, procedures, proposals, methods, and/or operational flowcharts disclosed in this document may be implemented using firmware or software and the firmware or software may be configured to include the modules, procedures, or functions. Firmware or software configured to perform the descriptions, functions, procedures, proposals, methods, and/or operational flowcharts disclosed in this document may be included in the one or more processors 102 and 202 or stored in the one or more memories 104 and 204 so as to be driven by the one or more processors 102 and 202. The descriptions, functions, procedures, proposals, methods, and/or operational flowcharts disclosed in this document may be implemented using firmware or software in the form of code, commands, and/or a set of commands.

The one or more memories 104 and 204 may be connected to the one or more processors 102 and 202 and store various types of data, signals, messages, information, programs, code, instructions, and/or commands. The one or more memories 104 and 204 may be configured by read-only memories (ROMs), random access memories (RAMs), electrically erasable programmable read-only memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be connected to the one or more processors 102 and 202 through various technologies such as wired or wireless connection.

The one or more transceivers 106 and 206 may transmit user data, control information, and/or radio signals/channels, mentioned in the methods and/or operational flowcharts of this document, to one or more other devices. The one or more transceivers 106 and 206 may receive user data, control information, and/or radio signals/channels, mentioned in the descriptions, functions, procedures, proposals, methods, and/or operational flowcharts disclosed in this document, from one or more other devices. For example, the one or more transceivers 106 and 206 may be connected to the one or more processors 102 and 202 and transmit and receive radio signals. For example, the one or more processors 102 and 202 may perform control so that the one or more transceivers 106 and 206 may transmit user data, control information, or radio signals to one or more other devices. The one or more processors 102 and 202 may perform control so that the one or more transceivers 106 and 206 may receive user data, control information, or radio signals from one or more other devices. The one or more transceivers 106 and 206 may be connected to the one or more antennas 108 and 208 and the one or more transceivers 106 and 206 may be configured to transmit and receive user data, control information, and/or radio signals/channels, mentioned in the descriptions, functions, procedures, proposals, methods, and/or operational flowcharts disclosed in this document, through the one or more antennas 108 and 208. In this document, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters.

Figure 15:
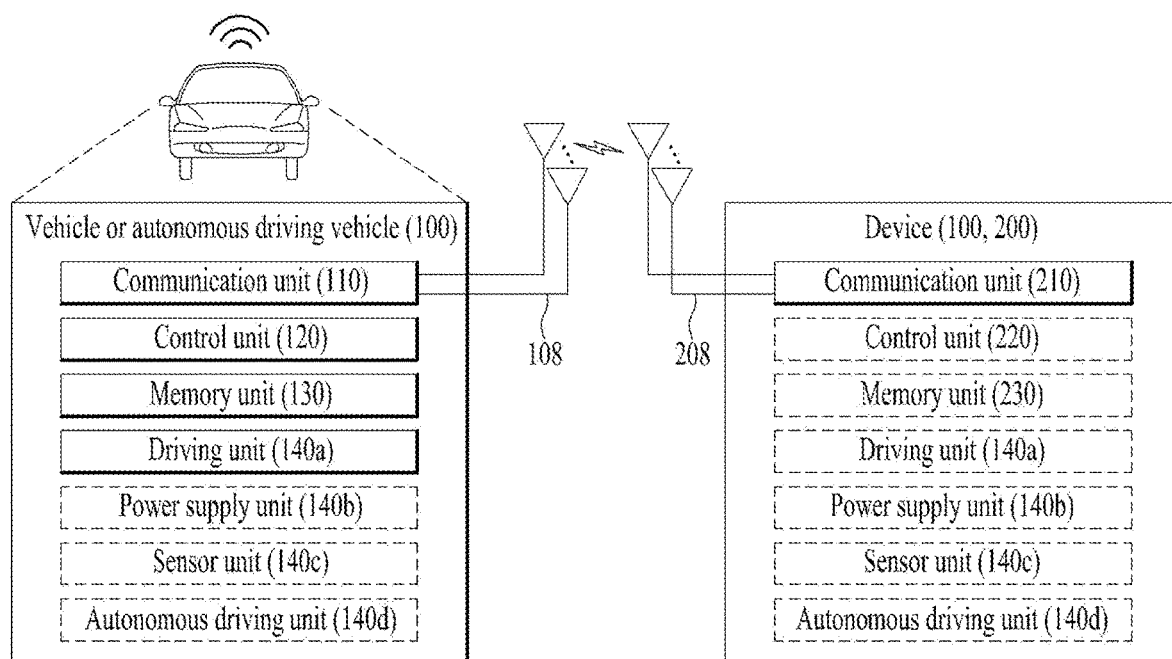

Examples of a vehicle or an autonomous driving vehicle applicable to the present disclosure FIG. 15 illustrates a vehicle or an autonomous driving vehicle applied to the present disclosure. The vehicle or autonomous driving vehicle may be implemented by a mobile robot, a car, a train, a manned/unmanned aerial vehicle (AV), a ship, etc.

Referring to FIG. 15, a vehicle or autonomous driving vehicle 100 may include an antenna unit 108, a communication unit 110, a control unit 120, a driving unit 140a, a power supply unit 140b, a sensor unit 140c, and an autonomous driving unit 140d. The antenna unit 108 may be configured as a part of the communication unit 110. The blocks 110/130/140a to 140d correspond to the blocks 110/130/140 of FIG. 43, respectively.

The communication unit 110 may transmit and receive signals (e.g., data and control signals) to and from external devices such as other vehicles, BSs (e.g., gNBs and road side units), and servers. The control unit 120 may perform various operations by controlling elements of the vehicle or the autonomous driving vehicle 100. The control unit 120 may include an ECU. The driving unit 140a may cause the vehicle or the autonomous driving vehicle 100 to drive on a road. The driving unit 140a may include an engine, a motor, a powertrain, a wheel, a brake, a steering device, etc. The power supply unit 140b may supply power to the vehicle or the autonomous driving vehicle 100 and include a wired/wireless charging circuit, a battery, etc. The sensor unit 140c may acquire a vehicle state, ambient environment information, user information, etc. The sensor unit 140c may include an inertial measurement unit (IMU) sensor, a collision sensor, a wheel sensor, a speed sensor, a slope sensor, a weight sensor, a heading sensor, a position module, a vehicle forward/backward sensor, a battery sensor, a fuel sensor, a tire sensor, a steering sensor, a temperature sensor, a humidity sensor, an ultrasonic sensor, an illumination sensor, a pedal position sensor, etc. The autonomous driving unit 140d may implement technology for maintaining a lane on which a vehicle is driving, technology for automatically adjusting speed, such as adaptive cruise control, technology for autonomously driving along a determined path, technology for driving by automatically setting a path if a destination is set, and the like.

For example, the communication unit 110 may receive map data, traffic information data, etc. from an external server. The autonomous driving unit 140d may generate an autonomous driving path and a driving plan from the obtained data. The control unit 120 may control the driving unit 140a such that the vehicle or the autonomous driving vehicle 100 may move along the autonomous driving path according to the driving plan (e.g., speed/direction control). In the middle of autonomous driving, the communication unit 110 may aperiodically/periodically acquire recent traffic information data from the external server and acquire surrounding traffic information data from neighboring vehicles. In the middle of autonomous driving, the sensor unit 140*c* may obtain a vehicle state and/or surrounding environment information. The autonomous driving unit 140*d* may update the autonomous driving path and the driving plan based on the newly obtained data/information. The communication unit 110 may transfer information about a vehicle position, the autonomous driving path, and/or the driving plan to the external server. The external server may predict traffic information data using AI technology, etc., based on the information collected from vehicles or autonomous driving vehicles and provide the predicted traffic information data to the vehicles or the autonomous driving vehicles.

Examples of a vehicle and AR/VR applicable to the present disclosure

Figure 16:
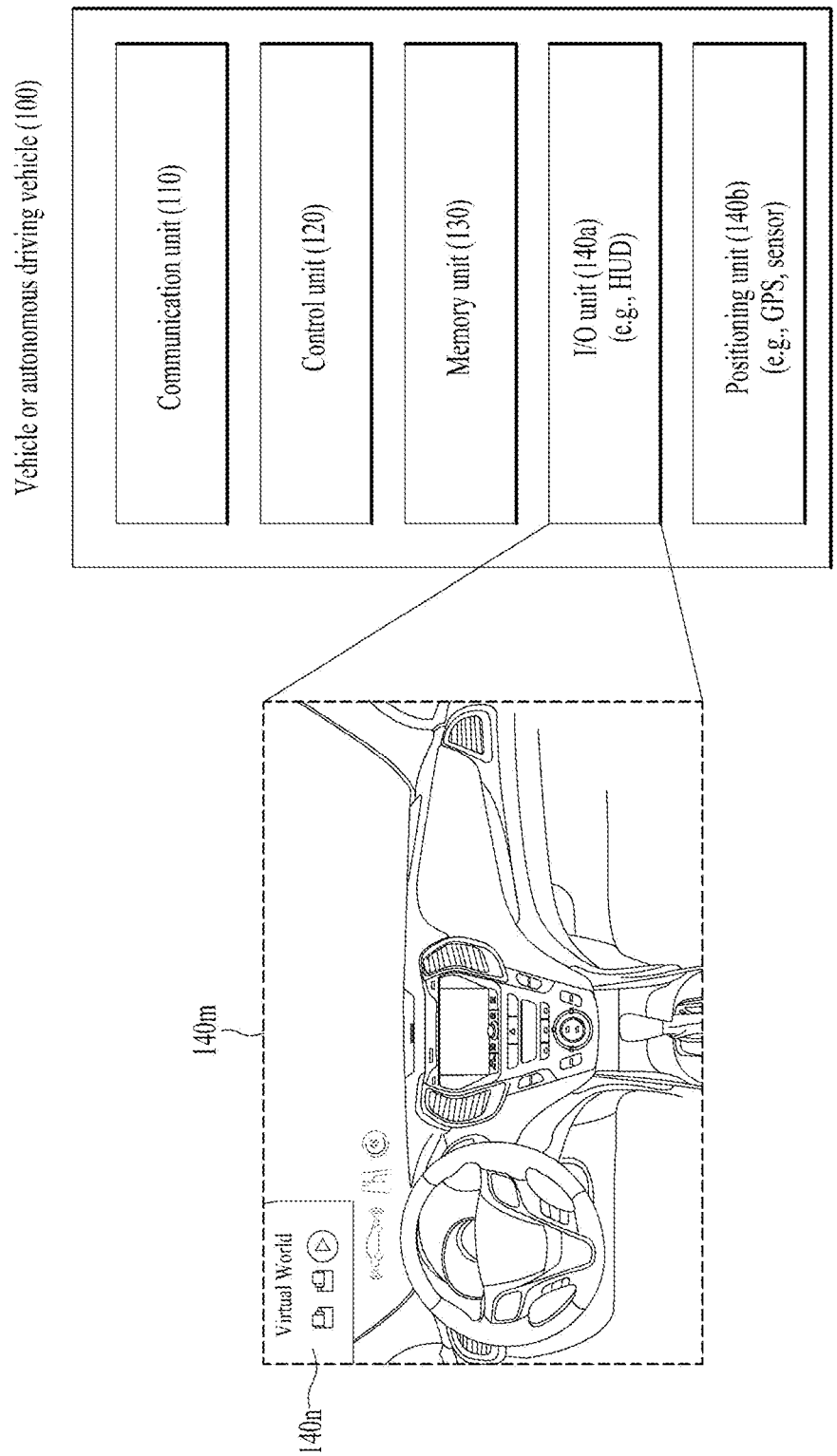

FIG. 16 illustrates a vehicle applied to the present disclosure. The vehicle may be implemented as a transport means, an aerial vehicle, a ship, etc.

Referring to FIG. 16, a vehicle 100 may include a communication unit 110, a control unit 120, a memory unit 130, an I/O unit 140*a*, and a positioning unit 140*b*. Herein, the blocks 110 to 130/140*a* and 140*b* correspond to blocks 110 to 130/140 of FIG. 43.

The communication unit 110 may transmit and receive signals (e.g., data and control signals) to and from external devices such as other vehicles or BSs. The control unit 120 may perform various operations by controlling constituent elements of the vehicle 100. The memory unit 130 may store data/parameters/programs/code/commands for supporting various functions of the vehicle 100. The I/O unit 140*a* may output an AR/VR object based on information within the memory unit 130. The I/O unit 140*a* may include an HUD. The positioning unit 140*b* may acquire information about the position of the vehicle 100. The position information may include information about an absolute position of the vehicle 100, information about the position of the vehicle 100 within a traveling lane, acceleration information, and information about the position of the vehicle 100 from a neighboring vehicle. The positioning unit 140*b* may include a GPS and various sensors.

As an example, the communication unit 110 of the vehicle 100 may receive map information and traffic information from an external server and store the received information in the memory unit 130. The positioning unit 140*b* may obtain the vehicle position information through the GPS and various sensors and store the obtained information in the memory unit 130. The control unit 120 may generate a virtual object based on the map information, traffic information, and vehicle position information and the I/O unit 140*a* may display the generated virtual object in a window in the vehicle (1410 and 1420). The control unit 120 may determine whether the vehicle 100 normally drives within a traveling lane, based on the vehicle position information. If the vehicle 100 abnormally exits from the traveling lane, the control unit 120 may display a warning on the window in the vehicle through the I/O unit 140*a*. In addition, the control unit 120 may broadcast a warning message regarding driving abnormity to neighboring vehicles through the communication unit 110. According to situation, the control unit 120 may transmit the vehicle position information and the information about driving/vehicle abnormality to related organizations.

Examples of an XR device applicable to the present disclosure

Figure 17:
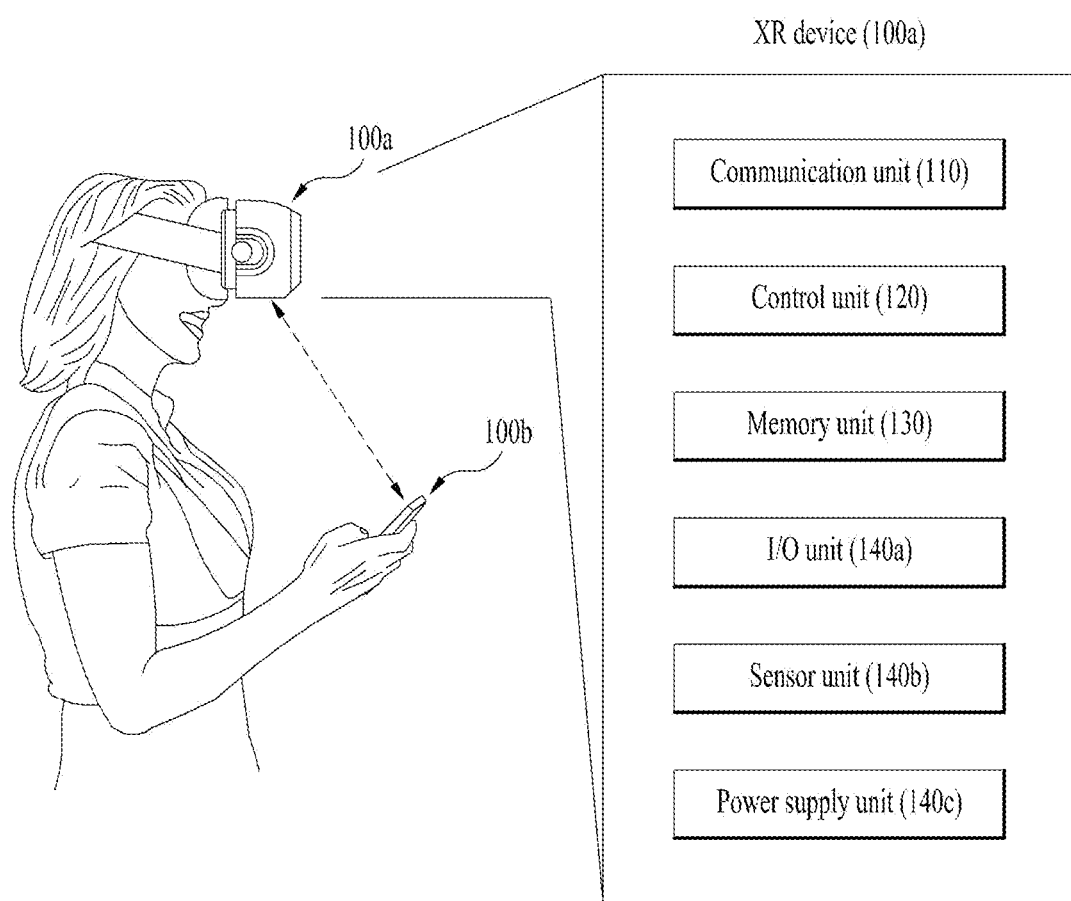

FIG. 17 illustrates an XR device applied to the present disclosure. The XR device may be implemented by an HMD, an HUD mounted in a vehicle, a television, a smartphone, a computer, a wearable device, a home appliance, a digital signage, a vehicle, a robot, etc.

Referring to FIG. 17, an XR device 100*a* may include a communication unit 110, a control unit 120, a memory unit 130, an I/O unit 140*a*, a sensor unit 140*b*, and a power supply unit 140*c*. Herein, the blocks 110 to 130/140*a* to 140*c* correspond to the blocks 110 to 130/140 of FIG. 43, respectively.

The communication unit 110 may transmit and receive signals (e.g., media data and control signals) to and from external devices such as other wireless devices, hand-held devices, or media servers. The media data may include video, images, and sound. The control unit 120 may perform various operations by controlling constituent elements of the XR device 100*a*. For example, the control unit 120 may be configured to control and/or perform procedures such as video/image acquisition, (video/image) encoding, and metadata generation and processing. The memory unit 130 may store data/parameters/programs/code/commands needed to drive the XR device 100*a*/generate XR object. The I/O unit 140*a* may obtain control information and data from the exterior and output the generated XR object. The I/O unit 140*a* may include a camera, a microphone, a user input unit, a display unit, a speaker, and/or a haptic module. The sensor unit 140*b* may obtain an XR device state, surrounding environment information, user information, etc. The sensor unit 140*b* may include a proximity sensor, an illumination sensor, an acceleration sensor, a magnetic sensor, a gyro sensor, an inertial sensor, an RGB sensor, an IR sensor, a fingerprint recognition sensor, an ultrasonic sensor, a light sensor, a microphone and/or a radar. The power supply unit 140*c* may supply power to the XR device 100*a* and include a wired/wireless charging circuit, a battery, etc.

For example, the memory unit 130 of the XR device 100*a* may include information (e.g., data) needed to generate the XR object (e.g., an AR/VR/MR object). The I/O unit 140*a* may receive a command for manipulating the XR device 100*a* from a user and the control unit 120 may drive the XR device 100*a* according to a driving command of a user. For example, when a user desires to watch a film or news through the XR device 100*a*, the control unit 120 transmits content request information to another device (e.g., a hand-held device 100*b*) or a media server through the communication unit 130. The communication unit 130 may download/stream content such as films or news from another device (e.g., the hand-held device 100*b*) or the media server to the memory unit 130. The control unit 120 may control and/or perform procedures such as video/image acquisition, (video/image) encoding, and metadata generation/processing with respect to the content and generate/output the XR object based on information about a surrounding space or a real object obtained through the I/O unit 140*a*/sensor unit 140*b*.

The XR device 100*a* may be wirelessly connected to the hand-held device 100*b* through the communication unit 110 and the operation of the XR device 100*a* may be controlled by the hand-held device 100*b*. For example, the hand-held device 100*b* may operate as a controller of the XR device 100*a*. To this end, the XR device 100*a* may obtain information about a 3D position of the hand-held device 100*b* and generate and output an XR object corresponding to the hand-held device 100*b*.

Examples of a robot applicable to the present disclosure

Figure 18:
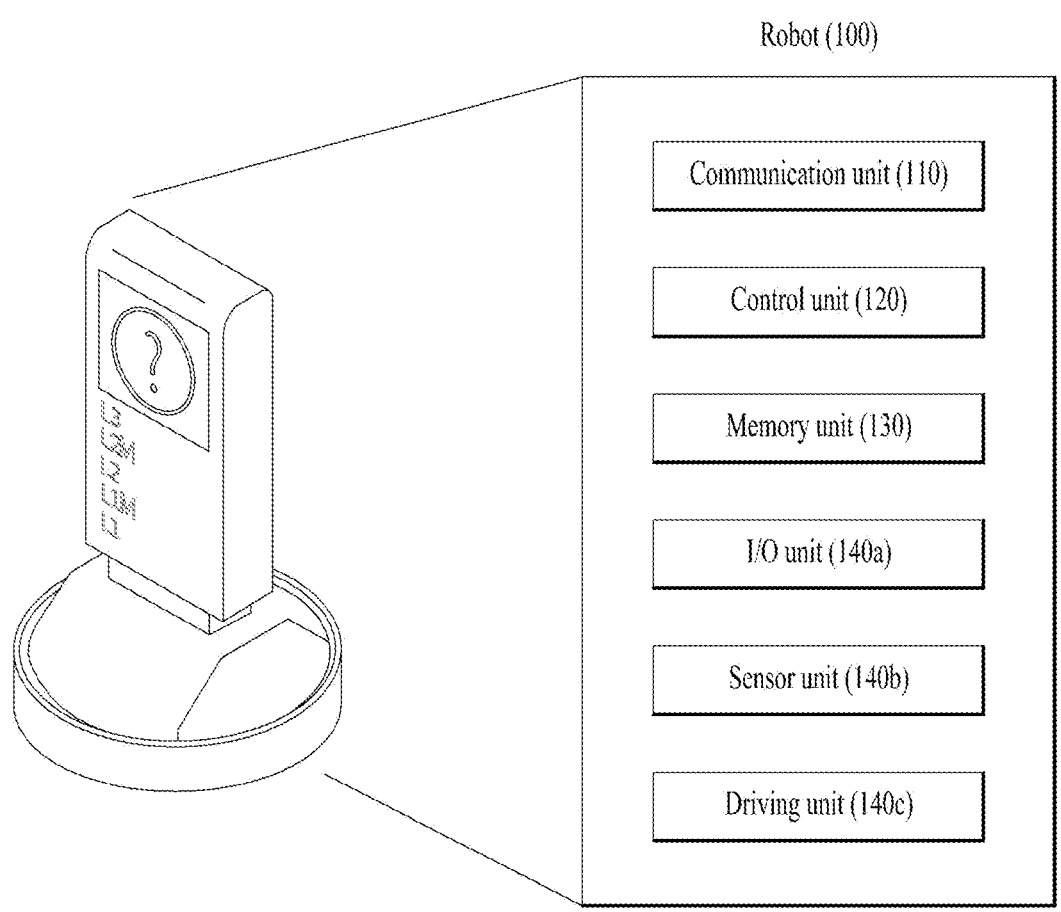

FIG. 18 illustrates a robot applied to the present disclosure. The robot may be categorized into an industrial robot, a medical robot, a household robot, a military robot, etc., according to a used purpose or field.

Referring to FIG. 18, a robot 100 may include a communication unit 110, a control unit 120, a memory unit 130, an I/O unit 140a, a sensor unit 140b, and a driving unit 140c. Herein, the blocks 110 to 130/140a to 140c correspond to the blocks 110 to 130/140 of FIG. 14, respectively.

The communication unit 110 may transmit and receive signals (e.g., driving information and control signals) to and from external devices such as other wireless devices, other robots, or control servers. The control unit 120 may perform various operations by controlling constituent elements of the robot 100. The memory unit 130 may store data/parameters/programs/code/commands for supporting various functions of the robot 100. The I/O unit 140a may obtain information from the exterior of the robot 100 and output information to the exterior of the robot 100. The I/O unit 140a may include a camera, a microphone, a user input unit, a display unit, a speaker, and/or a haptic module. The sensor unit 140b may obtain internal information of the robot 100, surrounding environment information, user information, etc. The sensor unit 140b may include a proximity sensor, an illumination sensor, an acceleration sensor, a magnetic sensor, a gyro sensor, an inertial sensor, an IR sensor, a fingerprint recognition sensor, an ultrasonic sensor, a light sensor, a microphone, a radar, etc. The driving unit 140c may perform various physical operations such as movement of robot joints. In addition, the driving unit 140c may cause the robot 100 to travel on the road or to fly. The driving unit 140c may include an actuator, a motor, a wheel, a brake, a propeller, etc.

Example of AI device to which the present disclosure is applied.

Figure 19:
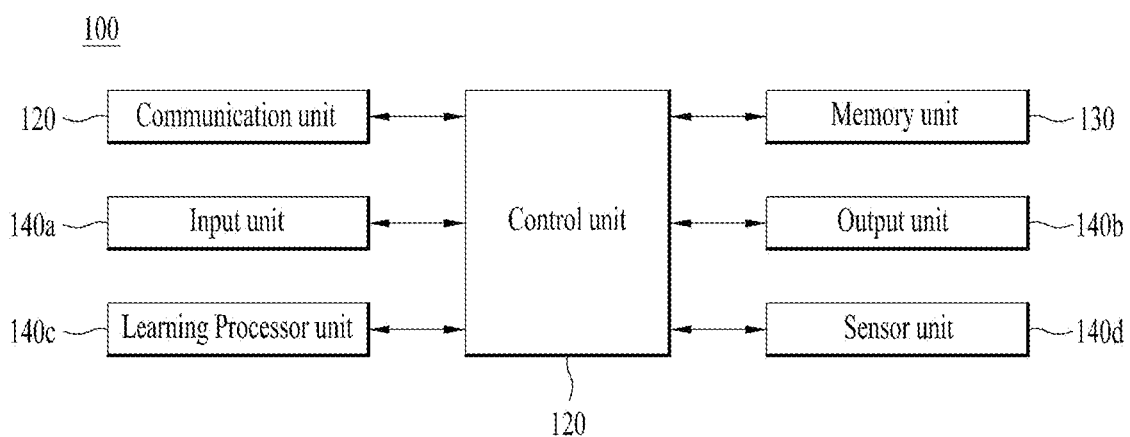

FIG. 19 illustrates an AI device applied to the present disclosure. The AI device may be implemented by a fixed device or a mobile device, such as a TV, a projector, a smartphone, a PC, a notebook, a digital broadcast terminal, a tablet PC, a wearable device, a Set Top Box (STB), a radio, a washing machine, a refrigerator, a digital signage, a robot, a vehicle, etc.

Referring to FIG. 19, an AI device 100 may include a communication unit 110, a control unit 120, a memory unit 130, an I/O unit 140a/140b, a learning processor unit 140c, and a sensor unit 140d. The blocks 110 to 130/140a to 140d correspond to blocks 110 to 130/140 of FIG. 14, respectively.

The communication unit 110 may transmit and receive wired/radio signals (e.g., sensor information, user input, learning models, or control signals) to and from external devices such as other AI devices (e.g., 100x, 200, or 400 of FIG. 13) or an AI server (e.g., 400 of FIG. 13) using wired/wireless communication technology. To this end, the communication unit 110 may transmit information within the memory unit 130 to an external device and transmit a signal received from the external device to the memory unit 130.

The control unit 120 may determine at least one feasible operation of the AI device 100, based on information which is determined or generated using a data analysis algorithm or a machine learning algorithm. The control unit 120 may perform an operation determined by controlling constituent elements of the AI device 100. For example, the control unit 120 may request, search, receive, or use data of the learning processor unit 140c or the memory unit 130 and control the constituent elements of the AI device 100 to perform a predicted operation or an operation determined to be preferred among at least one feasible operation. The control unit 120 may collect history information including the operation contents of the AI device 100 and operation feedback by a user and store the collected information in the memory unit 130 or the learning processor unit 140c or transmit the collected information to an external device such as an AI server (400 of FIG. 13). The collected history information may be used to update a learning model.

The memory unit 130 may store data for supporting various functions of the AI device 100. For example, the memory unit 130 may store data obtained from the input unit 140a, data obtained from the communication unit 110, output data of the learning processor unit 140c, and data obtained from the sensor unit 140. The memory unit 130 may store control information and/or software code needed to operate/drive the control unit 120.

The input unit 140a may acquire various types of data from the exterior of the AI device 100. For example, the input unit 140a may acquire learning data for model learning, and input data to which the learning model is to be applied. The input unit 140a may include a camera, a microphone, and/or a user input unit. The output unit 140b may generate output related to a visual, auditory, or tactile sense. The output unit 140b may include a display unit, a speaker, and/or a haptic module. The sensing unit 140 may obtain at least one of internal information of the AI device 100, surrounding environment information of the AI device 100, and user information, using various sensors. The sensor unit 140 may include a proximity sensor, an illumination sensor, an acceleration sensor, a magnetic sensor, a gyro sensor, an inertial sensor, an RGB sensor, an IR sensor, a fingerprint recognition sensor, an ultrasonic sensor, a light sensor, a microphone, and/or a radar.

The learning processor unit 140c may learn a model consisting of artificial neural networks, using learning data. The learning processor unit 140c may perform AI processing together with the learning processor unit of the AI server (400 of FIG. 13). The learning processor unit 140c may process information received from an external device through the communication unit 110 and/or information stored in the memory unit 130. In addition, an output value of the learning processor unit 140c may be transmitted to the external device through the communication unit 110 and may be stored in the memory unit 130.

The above-described embodiments of the present disclosure are applicable to various mobile communication systems.

What is claimed is:

1. An operation method of a user equipment (UE) in a wireless communication system, the method comprising:
   transmitting a $1^{st}$ stage sidelink control information (SCI) on a PSCCH; and
   transmitting a $2^{nd}$ stage SCI on a PSSCH,
   wherein:
   a first scrambling sequence related to the 1st stage SCI is generated based on a fixed value; and
   a second scrambling sequence related to the $2n^d$ stage SCI is generated based on a cyclic redundancy check (CRC) related value of the 1st stage SCI.

2. The method of claim 1, wherein the CRC related value is derived from CRC on a PSCCH.

3. The method of claim 1, wherein the fixed value is related to initialization of the first scrambling sequence.

4. The method of claim 1, wherein CRC on the PSCCH is related to initialization of the second scrambling sequence.

5. A user equipment (UE) in a wireless communication system, the UE comprising:
- at least one processor; and
- at least one computer memory operatively connected to the at least one processor and configured to store instructions that when executed causes the at least one processor to perform operations, the operations comprising:
- transmitting a $1^{st}$ stage sidelink control information (SCI) on a PSCCH; and
- transmitting a $2^{nd}$ stage SCI on a PSSCH,
- wherein:
  - a first scrambling sequence related to the $1^{st}$ stage SCI is generated based on a fixed value; and
  - a second scrambling sequence related to the $2^{nd}$ stage SCI is generated based on a cyclic redundancy check (CRC) related value of the 1st stage SCI.

6. The UE of claim 5, wherein the CRC related value is derived from CRC on a PSCCH.

7. The UE of claim 5, wherein the fixed value is related to initialization of the first scrambling sequence.

8. The UE of claim 5, wherein CRC on the PSCCH is related to initialization of the second scrambling sequence.

9. The UE of claim 5, wherein the UE communicates with at least one of another UE, a UE related to autonomous driving vehicle, a base station (BS), or a network.

10. A processor for performing operations for a user equipment (UE) in a wireless communication system, the operations comprising:
- transmitting a $1^{st}$ stage sidelink control information (SCI) on a PSCCH; and
- transmitting a $2^{nd}$ stage SCI on a PSSCH,
- wherein:
  - a first scrambling sequence related to the $1^{st}$ stage SCI is generated based on a fixed value; and
  - a second scrambling sequence related to the $2^{nd}$ stage SCI is generated based on a cyclic redundancy check (CRC) related value of the 1st stage SCI.

11. A non-transitory computer readable storage medium storing at least one computer program that includes instructions that, when executed by at least one processor, causes the at least one processor to perform operations for a user equipment, the operations comprising:
- transmitting a $1^{st}$ stage sidelink control information (SCI) on a PSCCH; and
- transmitting a $2^{nd}$ stage SCI on a PSSCH,
- wherein:
  - a first scrambling sequence related to the $1^{st}$ stage SCI is generated based on a fixed value; and a second scrambling sequence related to the $2^{nd}$ stage SCI is generated based on a cyclic redundancy check (CRC) related value of the 1st stage SCI.

* * * * *